(12) United States Patent
Hwang

(10) Patent No.: US 11,404,100 B2
(45) Date of Patent: Aug. 2, 2022

(54) MEMORY DEVICE AND METHOD OF OPERATING THE SAME

(71) Applicant: SK hynix Inc., Gyeonggi-do (KR)

(72) Inventor: Sung Hyun Hwang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 117 days.

(21) Appl. No.: 16/728,120

(22) Filed: Dec. 27, 2019

(65) Prior Publication Data

US 2020/0411073 A1    Dec. 31, 2020

(30) Foreign Application Priority Data

Jun. 27, 2019  (KR) ........................ 10-2019-0076741

(51) Int. Cl.
| | | |
|---|---|---|
| *G11C 16/04* | (2006.01) | |
| *G11C 11/4074* | (2006.01) | |
| *G11C 11/56* | (2006.01) | |
| *G11C 11/408* | (2006.01) | |
| *G11C 11/4094* | (2006.01) | |
| *G11C 16/10* | (2006.01) | |

(52) U.S. Cl.
CPC ...... *G11C 11/4074* (2013.01); *G11C 11/4085* (2013.01); *G11C 11/4094* (2013.01); *G11C 11/5628* (2013.01); *G11C 16/0483* (2013.01); *G11C 16/10* (2013.01)

(58) Field of Classification Search
CPC ............ G11C 11/4074; G11C 11/5628; G11C 11/4085; G11C 11/4094; G11C 16/3459; G11C 16/24; G11C 16/32; G11C 16/10; G11C 16/08; G11C 16/0483
See application file for complete search history.

(56) References Cited

U.S. PATENT DOCUMENTS

| | | | | |
|---|---|---|---|---|
| 10,008,271 B1* | 6/2018 | Diep | ...................... | G11C 16/10 |
| 10,438,671 B1* | 10/2019 | Chen | .................. | G11C 16/3427 |
| 10,665,299 B1* | 5/2020 | Lu | ...................... | G11C 16/0483 |
| 10,665,306 B1* | 5/2020 | Chen | .................. | G11C 16/3427 |
| 2002/0003722 A1* | 1/2002 | Kanda | .................... | G11C 16/10 |
| | | | | 365/185.17 |
| 2011/0122695 A1* | 5/2011 | Li | ...................... | G11C 11/5628 |
| | | | | 365/185.05 |

(Continued)

FOREIGN PATENT DOCUMENTS

| | | |
|---|---|---|
| KR | 10-2010-0106767 | 10/2010 |
| KR | 10-2018-0009580 | 1/2018 |
| KR | 10-2018-0105906 | 10/2018 |

*Primary Examiner* — Jay W. Radke
(74) *Attorney, Agent, or Firm* — IP & T Group LLP

(57) ABSTRACT

Provided herein may be a memory device having improved overshoot management performance, and a method of operating the memory device. The method may include: applying a select voltage to a select line coupled in common to respective select transistors in a plurality of cell strings; and applying a program voltage to a selected word line coupled in common to selected memory cells among a plurality of memory cells in the plurality of cell strings. The applying of the select voltage may include applying a first select voltage to the select line during a first time period. The applying of the program voltage may include applying, to the select line, a second select voltage having a voltage level higher than a voltage level of the first select voltage.

18 Claims, 18 Drawing Sheets

(56) References Cited

U.S. PATENT DOCUMENTS

| | | | |
|---|---|---|---|
| 2012/0033500 A1* | 2/2012 | Dutta | G11C 16/0483 365/185.19 |
| 2018/0277220 A1* | 9/2018 | Nakagawa | G11C 11/5671 |
| 2019/0066787 A1* | 2/2019 | Liang | G11C 16/0483 |
| 2019/0172540 A1* | 6/2019 | Maejima | G11C 16/3422 |
| 2019/0189218 A1* | 6/2019 | Izumi | G11C 16/08 |
| 2019/0371394 A1* | 12/2019 | Yang | G06F 11/1072 |
| 2019/0378581 A1* | 12/2019 | Zhao | G11C 16/10 |
| 2020/0090741 A1* | 3/2020 | Suzuki | G06F 11/1048 |
| 2020/0090756 A1* | 3/2020 | Shimura | G11C 16/10 |

* cited by examiner

| DATA | NUMBER OF 1S | COMPARISON WITH REFERENCE NUMBER | SELECT VOLTAGE | |
|---|---|---|---|---|
| | | | INITIAL SELECT VOLTAGE APPLICATION PERIOD | PROGRAM VOLTAGE APPLICATION PERIOD |
| D1 | X1 | X1 ≤ Xref | Vsel2 | |
| D2 | X2 | X2 > Xref | Vsel1 | Vsel2 |
| ⋮ | ⋮ | ⋮ | ⋮ | |
| Dk | Xk | Xk ≤ Xref | Vsel2 | |
| ⋮ | ⋮ | ⋮ | ⋮ | |
| Dm-1 | Xm-1 | Xm-1 > Xref | Vsel1 | Vsel2 |
| Dm | Xm | Xm ≤ Xref | Vsel2 | |

FIG. 15

| ADDR | LINE DISTANCE | COMPARISON WITH REFERENCE NUMBER | SELECT VOLTAGE | |
|---|---|---|---|---|
| | | | INITIAL SELECT VOLTAGE APPLICATION PERIOD | PROGRAM VOLTAGE APPLICATION PERIOD |
| A1 | DSTC1 | DSTC1 < DSTCref | Vsel1 | Vsel2 |
| A2 | DSTC2 | DSTC2 ≥ DSTCref | Vsel2 | |
| ⋮ | ⋮ | ⋮ | ⋮ | |
| Ak | DSTCk | DSTCk < DSTCref | Vsel1 | Vsel2 |
| ⋮ | ⋮ | ⋮ | ⋮ | |
| Am-1 | DSTCm-1 | DSTCm-1 ≥ DSTCref | Vsel2 | |
| Am | DSTCm | DSTCm < DSTCref | Vsel1 | Vsel2 |

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0076741, filed on Jun. 27, 2019, which is incorporated herein by reference in its entirety.

BACKGROUND

1. Field of Invention

Various embodiments of the present disclosure generally relate to an electronic device, and more particularly, to a memory device and a method of operating the memory device.

2. Description of Related Art

Generally, a storage device stores data under control of a host device such as a computer or a smartphone. The storage device may include a memory device configured to store data, and a memory controller configured to control the memory device. Generally, there are two types of memory devices: volatile memory devices and nonvolatile memory devices.

A volatile memory device stores data only when power is supplied thereto; data stored therein is lost when power is turned off. Examples of a volatile memory device include a static random access memory (SRAM), and a dynamic random access memory (DRAM).

In a nonvolatile memory device data stored therein is maintained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a memory device having improved overshoot management performance, and a method of operating the memory device.

An embodiment of the present disclosure may provide for a method of operating a memory device comprising a plurality of cell strings each including a select transistor and a plurality of memory cells, the method including: applying a select voltage to a select line coupled in common to respective select transistors in the plurality of cell strings; and applying a program voltage to a selected word line coupled in common to selected memory cells among the plurality of memory cells in the plurality of cell strings. The applying of the select voltage may include applying a first select voltage to the select line during a first time period. The applying of the program voltage may include applying, to the select line, a second select voltage having a voltage level higher than a voltage level of the first select voltage.

In an embodiment, the applying of the select voltage may further include: applying a pass voltage to unselected word lines coupled to unselected memory cells among the plurality of memory cells during a second time period following the first time period; and applying, to the select line, a third select voltage having a voltage level higher than the voltage level of the first select voltage during the second time period.

An embodiment of the present disclosure may provide for a method of operating a memory device comprising a plurality of cell strings each including a select transistor and a plurality of memory cells, the method including: applying a first select voltage to a select line coupled to the select transistor during a first time period; and applying a second select voltage to the select line while applying a program voltage to a selected word line coupled in common to selected memory cells among the plurality of memory cells in the plurality of cell strings during a second time period.

In an embodiment, the level of the first select voltage may be determined depending on the number of unselected cell strings that do not include the selected memory cells among the plurality of cell strings.

In an embodiment, the level of the first select voltage may be determined depending on a distance between the selected word line and the select line.

An embodiment of the present disclosure may provide for a memory device including: a plurality of cell strings each including a select transistor and memory cells coupled in series to each other; a peripheral circuit configured to perform a program operation of storing data in selected memory cells among the plurality of memory cells in the cell strings; and a control logic configured to control the peripheral circuit to apply a select voltage to a select line coupled in common to a plurality of select transistors in the cell strings and apply a program voltage to a selected word line coupled to the selected memory cells. The control logic may include a program operation controller configured to control the peripheral circuit to apply a first select voltage to the select line during a first time period and apply a second select voltage having a voltage level higher than a voltage level of the first select voltage to the select line while applying the program voltage to the selected word line, during a second time period.

An embodiment of the present disclosure may provide for a memory device including: a plurality of cell strings each including a select transistor and memory cells coupled in series; a peripheral circuit configured to perform a program operation of storing data in selected memory cells among the plurality of memory cells included in the cell strings; and control logic configured to control the peripheral circuit to apply a first select voltage to a select line coupled to the select transistor during a first time period, and apply a second select voltage to the select line while applying a program voltage to a selected word line coupled to the selected memory cells during a second time period, wherein the control logic determines the voltage level of the first select voltage based on the number of unselected cell strings among the cell strings or a line distance between the selected word line and the select line.

BRIEF DESCRIPTION OF THE DRAWINGS

FIG. 15 is a table illustrating aspects of a method of determining an initial select voltage based on a line distance.

DETAILED DESCRIPTION

Figure 1:
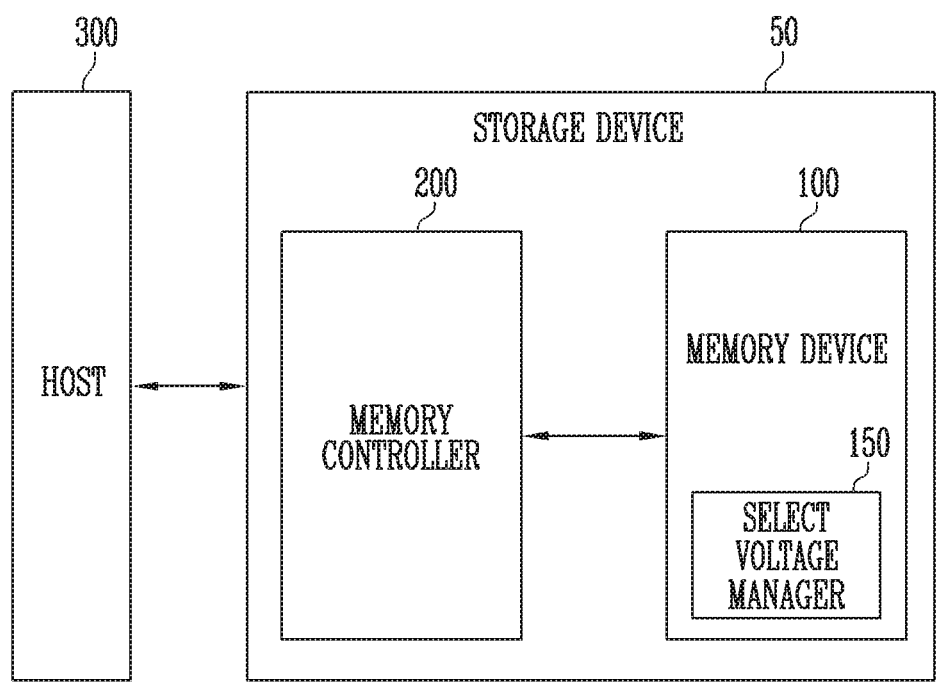
FIG. 1 is a block diagram illustrating a storage device in accordance with an embodiment of the present disclosure.

Specific structural and functional description are directed to various embodiments of the present disclosure. The present invention, however, is not limited to the disclosed embodiments nor any particular detail.

Rather, the present invention may be realized in many different forms and thus covers all modifications, equivalents and alternatives that fall within the spirit and scope of the present invention. Also, throughout the specification, reference to "an embodiment" or the like is not necessarily to only one embodiment, and different references to any such phrase are not necessarily to the same embodiment(s).

It will be understood that, although the terms "first", "second", etc. may be used herein to identify various elements, these elements should not be limited by these terms. These terms are only used to distinguish one element from another element. A first element in one instance could be termed a second element in another instance without implying any change in substance of the element itself.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly Indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure pertains. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art are omitted to avoid obscuring the subject matter of the present invention. This aims to make the subject matter of the present invention clear.

Various embodiments of the present disclosure are described more fully below with reference to the accompanying drawings, in which preferred embodiments of the present disclosure are shown, so that those skilled in the art can practice the present invention.

FIG. 1 is a block diagram illustrating a storage device 50 in accordance with an embodiment of the present disclosure.

Referring to FIG. 1, the storage device 50 may include a memory device 100 and a memory controller 200 configured to control the operation of the memory device 100.

The storage device 50 may be configured to store data under control of a host 300 such as a cellular phone, a smartphone, an MP3 player, a laptop computer, a desktop computer, a game machine, a TV, a tablet PC, or an in-vehicle infotainment system.

The storage device 50 may be configured as any of various types of storage devices depending on a host interface, which is a scheme for communicating with the host 300. For example, the data storage device 50 may be configured as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and/or a memory stick.

The storage device 50 may be manufactured in the form of any of various package types. For instance, the storage device 50 may be manufactured as a package on package (POP) type, a system in package (SIP) type, a system on chip (SOC) type, a multi-chip package (MCP) type, a chip on board (COB) type, a wafer-level fabricated package (WFP) type, and/or a wafer-level stack package (WSP) type.

The memory device 100 may store data therein. The memory device 100 may operate under control of the memory controller 200. The memory device 100 may include a memory cell array including a plurality of memory cells configured to store data therein.

The memory cells may include a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. Each memory block may include a plurality of pages. In an embodiment, each page may be the unit of storing data in the memory device 100 or reading stored data from the memory device 100. Each memory block may be the unit of erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, features and aspects of the present invention are described in the context that the memory device 100 is a NAND flash memory. However, other types of memory devices may be used.

The memory device 100 may receive a command and an address from the memory controller 200 and access an area of the memory cell array that is selected by the address. In other words, the memory device 100 may perform an operation corresponding to the command on the area selected by the address. For example, the memory device 100 may perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

In an embodiment, the memory device 100 may include a select voltage manager 150.

The select voltage manager 150 may manage, during a program operation, information on a select voltage to be applied to a select line. The information on the select voltage may include information on a voltage level of the select voltage and a time at which the select voltage is to be applied (voltage application timing).

The voltage level of the select voltage may be determined based on the number of unselected cell strings For example, if the number of unselected cell strings is greater than a reference number, a first select voltage having a voltage level lower than that of a second select voltage that is a target voltage level may be applied to the select line. In an embodiment, if the number of unselected cell strings is equal to or less than the reference number, a third select voltage having a voltage level higher than that of the first select voltage and less than that of the second select voltage may be applied to the select line.

The voltage level of the select voltage may be determined based on a line distance between the select line and a selected word line. In an embodiment, if the distance between the selected word line and the select line is less than a reference distance, the first select voltage having a voltage level lower than that of the second select voltage that is the target voltage level may be applied to the select line. Alternatively, if the distance between the selected word line and the select line is greater than or equal to the reference distance, the third select voltage having a voltage level higher than that of the first select voltage and less than that of the second select voltage may be applied to the select line. In various embodiments, the first select voltage or the third select voltage may be applied to the select line, and a voltage increasing in stages to the second select voltage may be applied to the select line.

A timing at which the select voltage is applied may be determined based on a time point at which a channel of an unselected cell string is boosted. For example, a voltage increasing in stages may be applied to the select line, based on a time point at which a pass voltage is applied or a time point at which a program voltage is applied.

In the memory device 100, the voltage level and application timing of the select voltage are managed, so as to reduce or minimize an overshoot which may occur while the select voltage to be applied to the select line reaches the target voltage level, and to reduce or minimize a rising time which is the time it takes for the select voltage to reach the target voltage level.

The memory controller 200 may control overall operations of the storage device 50.

When power is applied to the storage device 50, the memory controller 200 may execute firmware. In the case where the memory device 100 is a flash memory device, the memory controller 200 may execute firmware such as a flash translation layer (FTL) for controlling communication between the host 300 and the memory device 100.

In an embodiment, the memory controller 200 may receive data and a logical block address (LBA) from the host 300, and translate the LBA into a physical block address (PBA) indicating addresses of memory cells to which data is to be stored, the memory cells being included in the memory device 100.

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a program command, an address and data in the absence of a request from the host 300, and transmit them to the memory device 100. For example, the memory controller 200 may provide a command, an address and data to the memory device 100 to perform background operations such as a program operation for wear leveling, and a program operation for garbage collection.

The host 300 may communicate with the storage device 50 using at least one of various communication methods, such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and/or load reduced DIMM (LRDIMM) communication methods.

Figure 2:
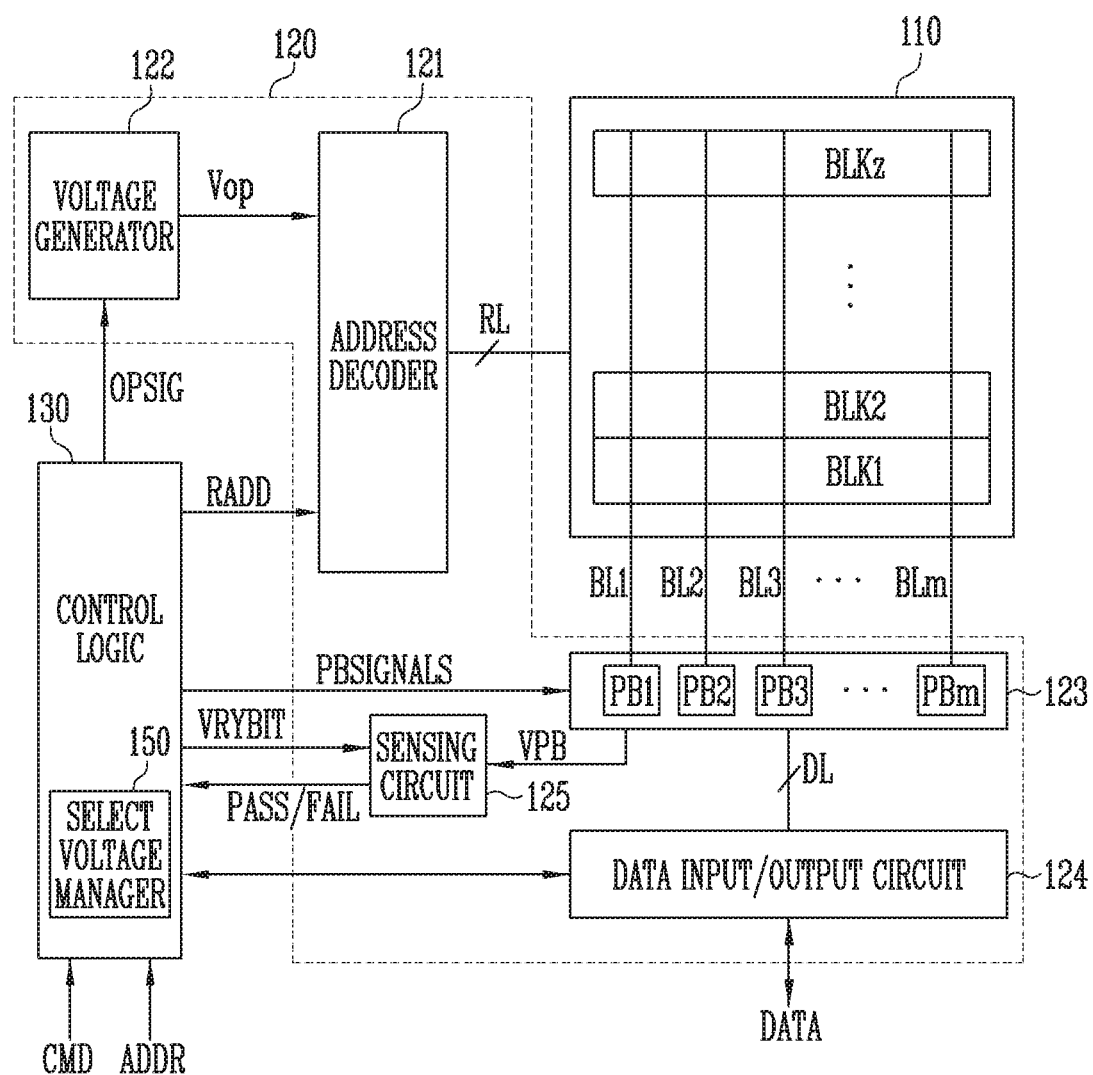
FIG. 2 is a block diagram illustrating a configuration of a memory device of FIG. 1.

FIG. 2 is a block diagram illustrating a configuration of the memory device 100 of FIG. 1.

Referring to FIG. 2, the memory device 100 may include a memory cell array 110, a peripheral circuit 120, and control logic 130.

The memory cell array 110 may include a plurality of memory blocks BLK1 to BLKz. The plurality of memory blocks BLK1 to BLKz are coupled to an address decoder 121 through row lines RL. The memory blocks BLK1 to BLKz may be coupled to a read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line are defined as one page. In other words, the memory cell array 110 may be formed of a plurality of physical pages. In an embodiment, each of the memory blocks BLK1 to BLKz included in the memory cell array 110 may include a plurality of dummy cells. One or more dummy cells may be coupled in series between a drain select transistor and the memory cells, and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

In an embodiment, the row lines RL may be local lines included in local line groups. Each local line group may correspond to one memory block. The local line group may include a drain select line, local word lines, and a source select line.

The address decoder 121 may operate under control of the control logic 130. The address decoder 121 may receive a row address RADD from the control logic 130.

The address decoder 121 may decode a block address among the received row address RADD. The address decoder 121 may select at least one of the memory blocks BLK1 to BLKz according to the block address. The address decoder 121 may select at least one word line WL of the selected memory block by applying voltages supplied from the voltage generator 122 to at least one word line WL according to the row address RADD.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of a read voltage to unselected word lines.

In an embodiment, an erase operation of the memory device 100 may be performed on a memory block basis. During the erase operation, an address ADDR to be input to the memory device 100 includes a block address. The address decoder 121 may decode the block address and select a memory block corresponding to the decoded block address. During the erase operation, the address decoder 121 may apply a ground voltage to word lines coupled to the selected memory block.

The voltage generator 122 may generate a plurality of operating voltages Vop using an external supply voltage supplied to the memory device 100. The voltage generator 122 may operate under control of the control logic 130.

In an embodiment, the voltage generator 122 may generate an internal supply voltage by regulating an external supply voltage. The internal supply voltage generated from the voltage generator 122 may be used as an operating voltage of the memory device 100.

In an embodiment, the voltage generator 122 may generate a plurality of operating voltages Vop using an external supply voltage or an internal supply voltage. The voltage generator 122 may generate various voltages for the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, for generating a plurality of operating voltages Vop having various voltage levels, a plurality of pumping capacitors configured to receive an internal supply voltage, and may generate a plurality of operating voltages Vop by selectively enabling the plurality of pumping capacitors under control of the control logic 130.

The generated operating voltages Vop may be supplied to the memory cell array 110 by the address decoder 121.

The read/write circuit 123 may include first to m-th page buffers PB1 to PBm, which may be coupled to the memory cell array 110 through the first to m-th bit lines BL to BLm, respectively. The first to m-th page buffers PB1 to PBm may operate under control of the control logic 130.

The first to m-th page buffers PB1 to PBm may communicate data DATA with the data input/output circuit 124. During a program operation, the first to m-th page buffers PB1 to PBm may receive the data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data DATA to the first to m-th page buffers PB1 to PBm.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) for receiving inputted data DATA. During a program operation, the data input/output circuit 124 may receive data DATA to be stored from an external controller (not shown). During a read operation, the data input/output circuit 124 may output, to the external controller, the data DATA received from the first to m-th page buffers PB1 to PBm included in the read/write circuit 123.

During a read operation or a program verify operation, the sensing circuit 125 may generate reference current in response to an enable bit signal VRYBIT generated by the control logic 130, compare a sensing voltage VPB received from the read/write circuit 123 with a reference voltage generated by the reference current, and output a pass signal PASS or a fail signal FAIL to the control logic 130.

The control logic 130 may be coupled to the address decoder 121, the voltage generation unit 122, the read/write circuit 123, the data input/output circuit 124, and the sensing circuit 125. The control logic 130 may control the overall operation of the memory device 100. The control logic 130 may operate in response to a command CMD transmitted from an external device.

The control circuit 130 may generate various signals in response to the command CMD and the address ADD, and control the peripheral circuit 120. For example, the control logic 130 may generate an operating signal OPSIG, the row address RADD, a read/write control signal PBSIGNALS, and the enable bit signal VRYBIT in response to the command CMD and the address ADD. The control logic 130 may output the operating signal OPSIG to the voltage generation unit 122, output the row address RADD to the address decoder 121, output the read/write control signal PBSIGNALS to the read/write circuit 123, and output the enable bit signal VRYBIT to the sensing circuit 125. Furthermore, the control logic 130 may determine whether target memory cells have passed or failed a verification during the program verify operation in response to the pass signal PASS or the fail signal FAIL that is output from the sensing circuit 125.

In an embodiment, the control logic 130 may include a select voltage manager 150.

The select voltage manager 150 may generate select voltage Information in response to the address ADDR and the data DATA that are provided from the memory controller 200. The select voltage information may include information about a level of the select voltage and a time at which the select voltage is to be applied (voltage application timing).

The voltage level of the select voltage may be determined based on the number of unselected cell strings or a line distance between a select line and a selected word line. For example, if the number of unselected cell strings is greater than a reference number, a first select voltage having a voltage level lower than that of a second select voltage that is a target voltage level may be applied to the select line. In an embodiment, if the number of unselected cell strings is less than or equal to the reference number, a third select voltage having a voltage level higher than that of the first select voltage and less than that of the second select voltage may be applied to the select line.

In an embodiment, if the distance between the selected word line and the select line is less than a reference distance, the first select voltage may be applied to the select line. Alternatively, if the distance between the selected word line and the select line is greater than or equal to the reference distance, the third select voltage may be applied to the select line. In various embodiments, the first select voltage or the third select voltage may be applied to the select line, and a voltage increasing in stages to the second select voltage may be applied to the select line.

A timing at which the select voltage is applied may be determined based on when a channel of an unselected cell string is boosted. For example, a voltage increasing in stages may be applied to the select line, based on a time at which a pass voltage is applied or a time at which a program voltage is applied.

In the memory device 100, the voltage level and application timing of the select voltage are managed, so as to reduce or minimize an overshoot which may occur while a voltage to be applied to the select line reaches the target voltage level, and to reduce or minimize the time it takes for the select voltage to reach the target voltage level.

Figure 3:
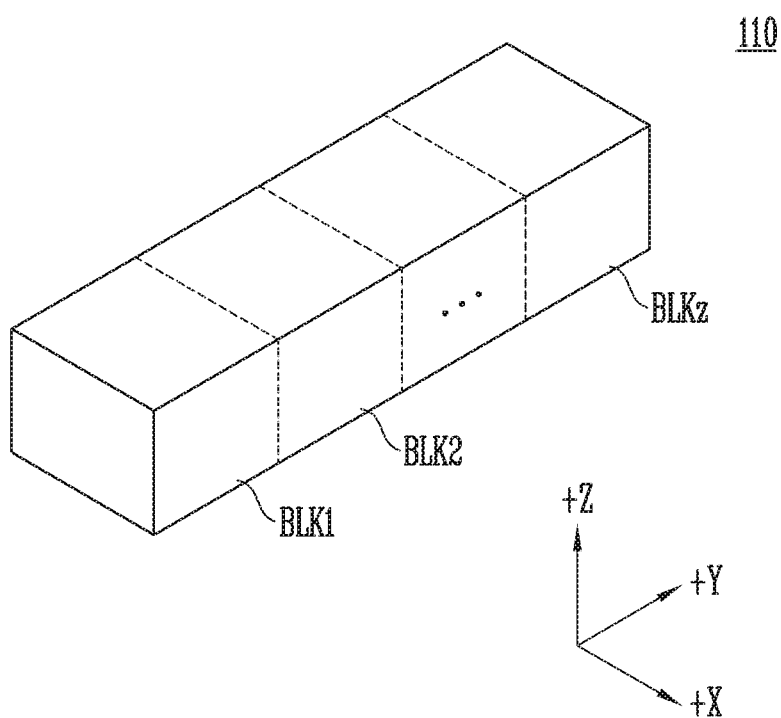
FIG. 3 is a diagram illustrating an embodiment of a memory cell array of FIG. 2.

FIG. 3 is a diagram illustrating an embodiment of a memory cell array 110 of FIG. 2.

Referring to FIG. 3, the memory cell array 110 may include a plurality of memory blocks BLK1 to BLKz. Each memory block has a three-dimensional structure. Each memory block may Include a plurality of memory cells stacked on a substrate. The memory cells are arranged in mutually orthogonal directions, i.e., a +X direction, a +Y direction, and a +Z direction as shown in FIG. 3. The structure of each memory block is described in more detail with reference to FIGS. 4 and 5.

Figure 4:
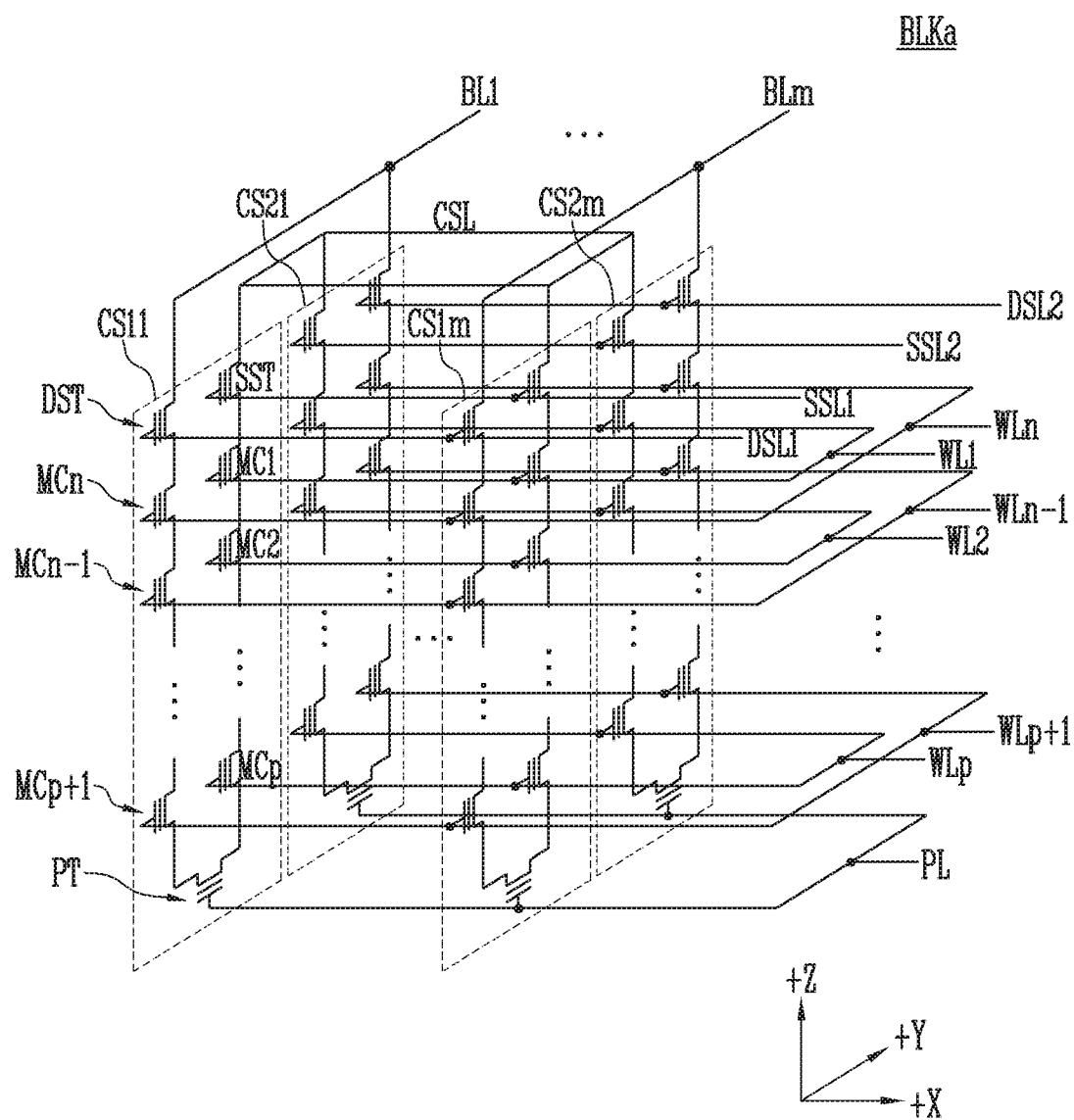
FIG. 4 is a circuit diagram illustrating a representative memory block of memory blocks of FIG. 3, in accordance with an embodiment of the present disclosure.

FIG. 4 is a circuit diagram illustrating any one memory block BLKa of memory blocks BLK1 to BLKz of FIG. 3, in accordance with an embodiment of the present disclosure.

Referring to FIG. 4, the memory block BLKa may include a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings may be arranged in a row direction (i.e., the +X direction). In FIG. 4, two cell strings are illustrated as being arranged in a column direction (i.e., the +Y direction). However, this illustration is made only for clarity; it will be understood that three or more cell strings may be arranged in the column direction.

Each of the plurality of cell strings CS11 to CS1*m* and CS21 to CS2*m* may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling Insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking Insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a −Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to the respective even bit lines. Odd-number-th cell strings of the cell strings CS11 to CS1m or CS21 to CS2m arranged in the row direction may be coupled to the respective odd bit lines.

In an embodiment, at least one of the first to n-th memory cells MC1 to MCn may be used as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the dummy memory cell(s), each may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
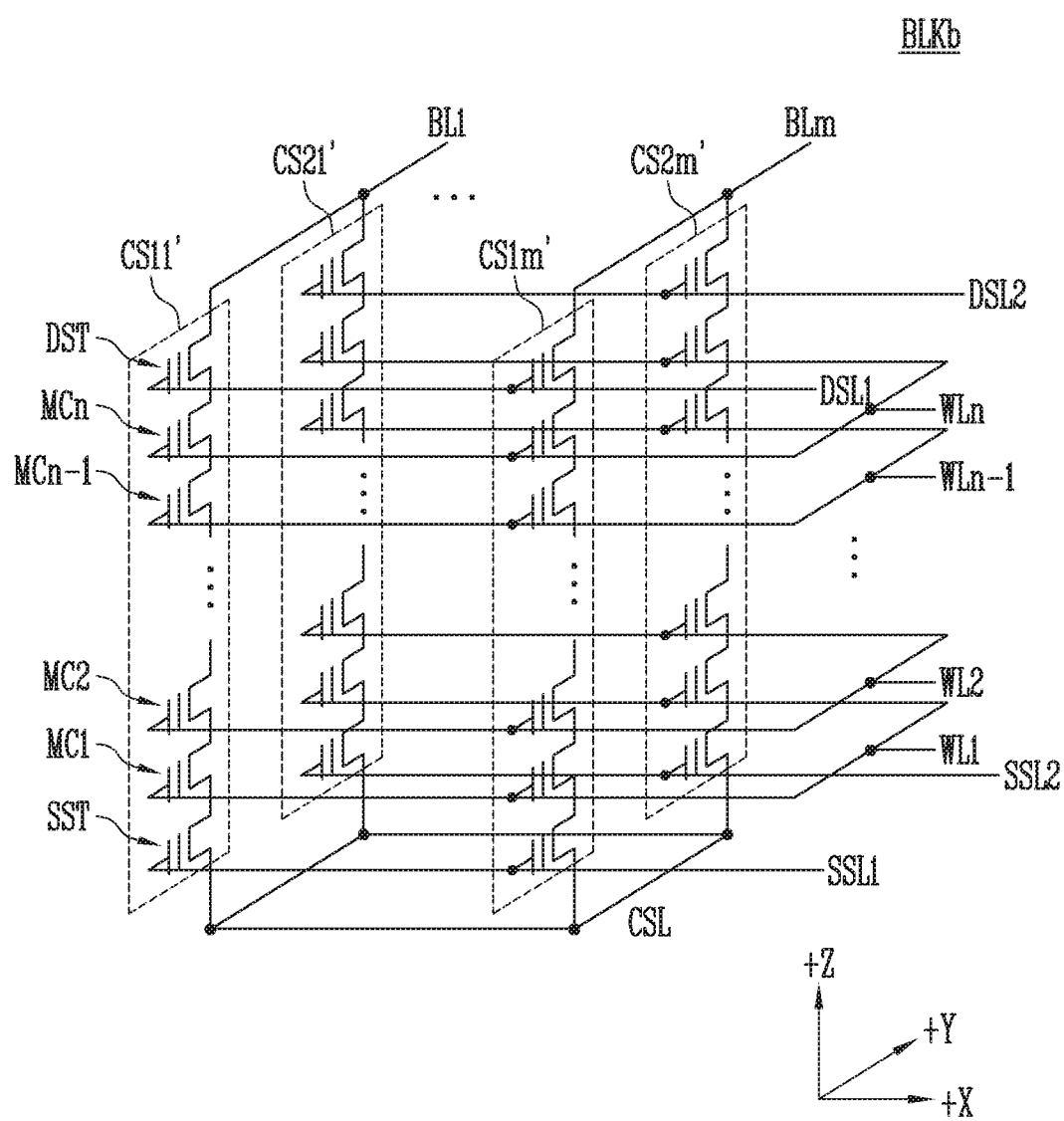
FIG. 5 is a circuit diagram illustrating a representative memory block of the memory blocks of FIG. 3, in accordance with an embodiment of the present disclosure.

FIG. 5 is a circuit diagram illustrating any one memory block BLKb of the memory blocks BLK1 to BLKz of FIG. 3, in accordance with an embodiment of the present disclosure.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequently, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, one or more dummy memory cells may be provided to reduce an electric field between the source select transistor SST and the memory cells MC1 to MCn. Alternatively, one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the dummy memory cell(s), each may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
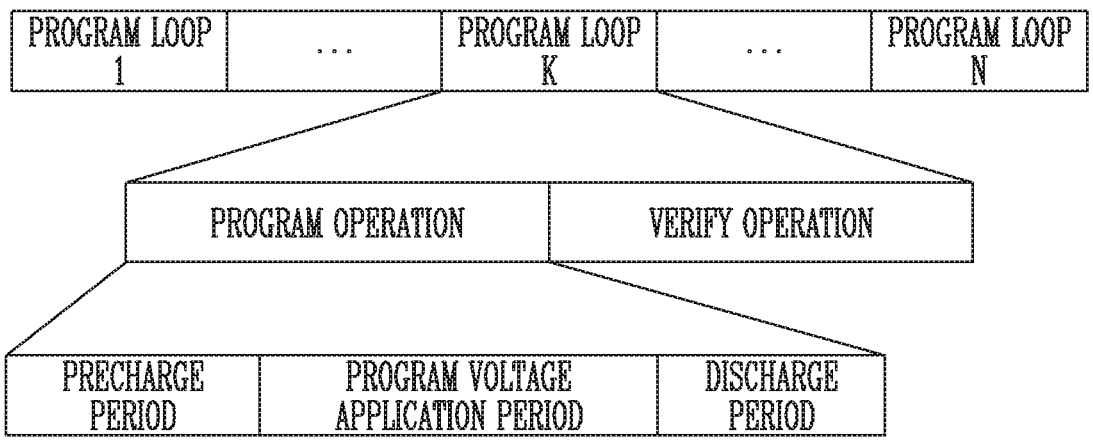
FIG. 6 is a diagram for describing a program cycle.

FIG. 6 is a diagram for describing a program cycle.

Referring to FIG. 6, the program cycle may be performed in an incremental step program pulse (ISPP) scheme including a plurality of program loops. The ISPP scheme may include applying a program pulse increased in each subsequent step to a selected word line. The program loops may include program operations using different program voltages, respectively. For example, program loop 1 may include a program operation of applying a first program voltage to the selected word line. Program loop 2 may include a program operation of applying a second program voltage higher than the first program voltage by a step voltage to the selected word line.

Each program loop may include a program operation of storing data in a memory cell, and a verify operation of verifying the stored data. The program operation may include a precharge period in which a voltage is applied to a bit line coupled to corresponding cell strings, a program voltage application period in which a program voltage is applied to the selected word line, and a discharge period in which voltages applied to the word lines and the bit lines are discharged.

The precharge period may include an initial select voltage application period in which a select voltage is applied to a drain select line, and a pass voltage application period in which a pass voltage is applied to an unselected word line.

Since the select voltage is applied to the drain select line, the voltage precharged to the bit line may be transmitted to a channel of each corresponding cell string. Since the pass voltage is applied to the unselected word line, a channel voltage of an unselected cell string may be increased.

During the program voltage application period, a program voltage may be applied to the selected word line. The program voltage may be applied to the selected word line such that the threshold voltage of the selected memory cell is included in a desired threshold voltage distribution. Each time a program loop is successively performed, the program voltage may be increased by a step voltage.

During the discharge period, an operation of discharging the voltages that have been applied to the bit lines, the word lines, or the select lines may be performed.

Figure 7:
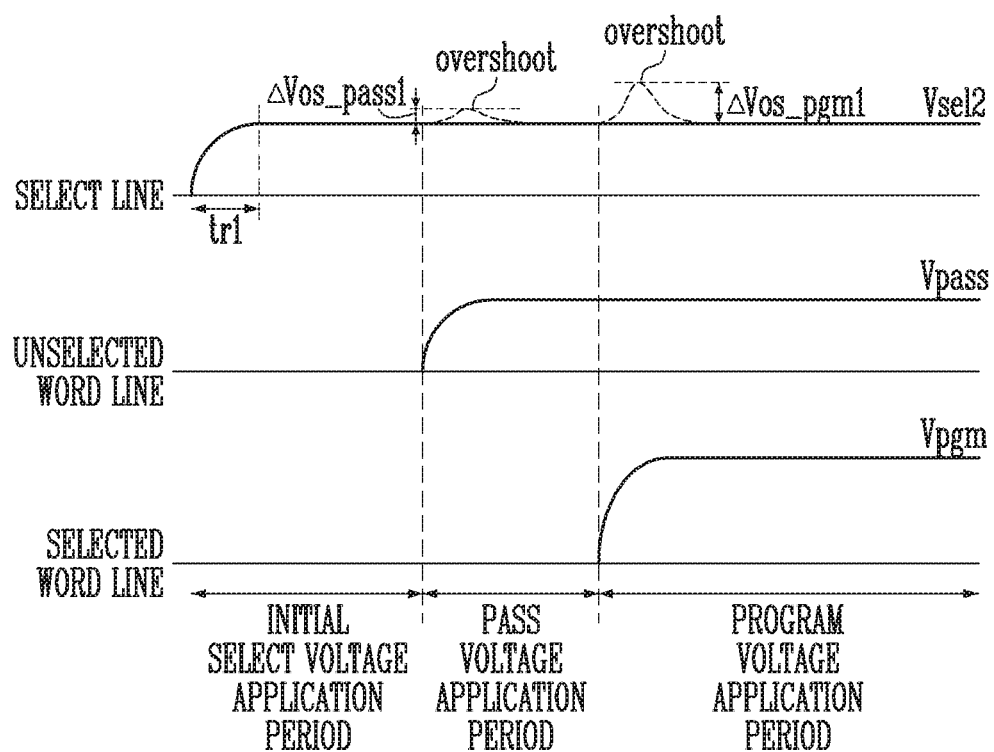
FIG. 7 is a timing diagram for describing a precharge period and a program voltage application period.

FIG. 7 is a timing diagram for describing a precharge period and a program voltage application period.

Referring to FIG. 7, the precharge period may include an initial select voltage application period and a pass voltage application period.

During the initial select voltage application period, a target select voltage Vsel2 may be applied to a select line. The target select voltage Vsel2 may have a voltage level equal to that of an Inhibit voltage applied to a bit line coupled to an unselected cell string. The voltage level of the select line may reach the target select voltage Vsel2 after a rising time tr1 has passed from at a time point at which the select voltage is applied. The target select voltage Vsel2 applied to the select line may be maintained until the program voltage application period.

During the pass voltage application period, a pass voltage Vpass may be applied to an unselected word line. The pass voltage Vpass may be a voltage needed for a channel of each of unselected memory cells in the selected cell string to be in a conductive state. When the channel of the unselected memory cell enters a conductive state, a voltage precharged to a bit line coupled to the selected cell string may be transmitted to a channel of a selected memory cell. When the pass voltage Vpass is applied to the unselected word line, the channel of the unselected cell string may float. Furthermore, when the pass voltage Vpass is applied to the unselected word line, the channel voltage of the unselected cell string may be increased by a self-boosting scheme. Due to an increase of the channel voltage, the voltage of the select line may not be maintained at the target select voltage Vsel2, but a first pass overshoot ΔVos_pass1 may occur for a set time.

During the program voltage application period, a program voltage Vpgm may be applied to the selected word line. The program voltage Vpgm may be a voltage needed for the threshold voltages of the selected memory cells to be included in a desired threshold voltage distribution. The program voltage Vpgm may be a voltage higher than the pass voltage Vpass. When the program voltage Vpgm is applied to the selected word line, the channel voltage of the unselected cell string may be increased by the self-boosting scheme. Due to an increase of the channel voltage, the voltage of the select line may not be maintained at the target select voltage Vsel2, but a first program overshoot ΔVos_pgm1 may occur for a set time.

To increase the voltage level of the select line from a ground level GND to the target select voltage Vsel2, a first rising time tr1 may elapse.

Figure 8:
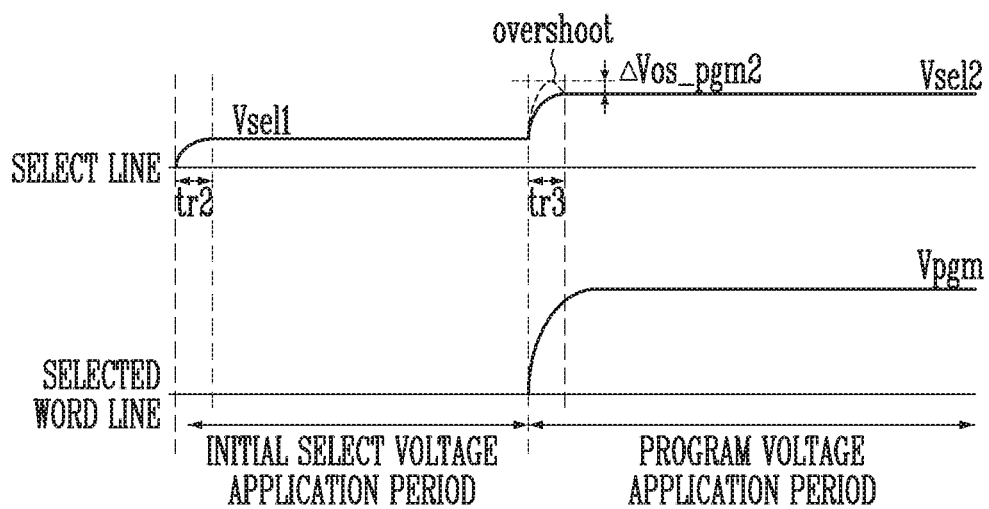
FIG. 8 is a timing diagram illustrating a select voltage application method in accordance with an embodiment of the present disclosure.

FIG. 8 is a timing diagram for describing a select voltage application method in accordance with an embodiment of the present disclosure.

Referring to FIG. 8, during an initial select voltage application period, an initial select voltage Vsel1 may be applied to a select line. During a program voltage application period, a program voltage Vpgm may be applied to a selected word line, and a target select voltage Vsel2 may be applied to the select line. The initial select voltage Vsel1 may have a positive voltage level. The initial select voltage Vsel1 may have a voltage level lower than that of the target select voltage Vsel2.

When the program voltage Vpgm is applied to the selected word line while the initial select voltage Vsel1 is applied to the select line, a program overshoot may occur. Since the voltage to be applied to the select line is increased to the target select voltage Vsel2 while the overshoot occurs, a second program overshoot ΔVos_pgm2 having a magnitude less than that of the first program overshoot ΔVos_pgm1 illustrated in FIG. 7 may occur.

Furthermore, as the voltage to be applied to the select line is increased to the target select voltage Vsel2 while the overshoot occurs, the time needed to increase the voltage level of the select line to the target select voltage Vsel2 may be reduced. In other words, the voltage level of the select voltage may be rapidly increased to the target select voltage Vsel2 using the fact that the voltage level is increased by the overshoot. In an embodiment, a second rising time tr2 is needed to increase the voltage level of the select line from ground level GND to the initial select voltage Vsel1, and a third rising time tr3 is needed to increase the voltage level from the initial select voltage Vsel1 to the target select voltage Vsel2. The sum of the second rising time tr2 and the third rising time tr3 may be less than the first rising time tr1 described in FIG. 7.

By way of example, FIG. 8 illustrates that the program voltage Vpgm and the target select voltage Vsel2 are simultaneously applied. However, the target select voltage Vsel2 may be applied at another time during which an overshoot due to the program voltage Vpgm is present. For example, the target select voltage Vsel2 may be applied during a rising time of the program voltage Vpgm.

Figure 9:
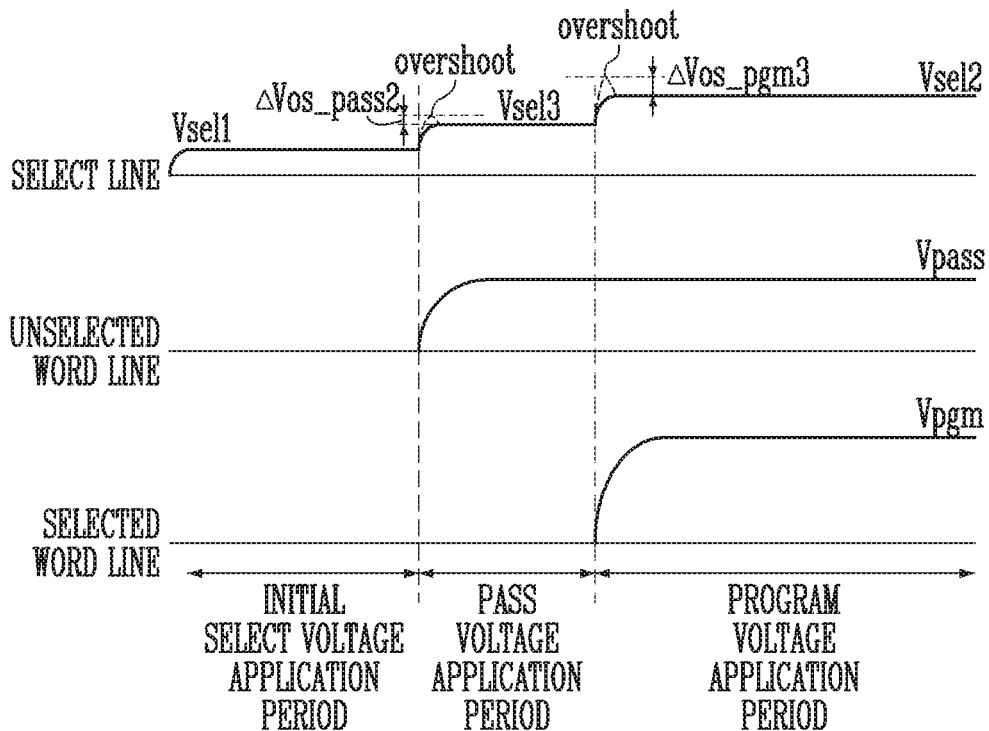
FIG. 9 is a timing diagram illustrating a select voltage application method in accordance with an embodiment of the present disclosure.

FIG. 9 is a timing diagram for describing a select voltage application method in accordance with an embodiment of the present disclosure.

Referring to FIG. 9, during an initial select voltage application period, an initial select voltage Vsel1 may be applied to a select line. During a pass voltage application period, a pass voltage Vpass may be applied to an unselected word line, and an intermediate select voltage Vsel3 may be applied to the select line. During a program voltage application period, a program voltage Vpgm may be applied to a selected word line, and a target select voltage Vsel2 may be applied to the select line. The target select voltage Vsel2 may have a voltage level equal to an inhibit voltage precharged to a bit line coupled to an unselected cell string. The initial select voltage Vsel1 may have a voltage level greater than zero. The intermediate select voltage Vsel3 may have an intermediate voltage level between the initial select voltage Vsel1 and the target select voltage Vsel2.

When the pass voltage Vpass is applied to the selected word line while the initial select voltage Vsel1 is applied to the select line, an overshoot may occur. Since the voltage to be applied to the select line is increased to the intermediate select voltage Vsel3 while the overshoot occurs, a second pass overshoot ΔVos_pass2 having a magnitude less than that of the first pass overshoot ΔVos_pass1 illustrated in FIG. 7 may occur.

By way of example, FIG. 9 illustrates that the pass voltage Vpass and the intermediate select voltage Vsel3 are simultaneously applied. However, the intermediate select voltage Vsel3 may be applied at another time during which an overshoot due to the pass voltage Vpass is present. For example, the intermediate select voltage Vsel3 may be applied during a rising time of the program voltage Vpass.

When the program voltage Vpgm is applied to the selected word line while the intermediate select voltage Vsel3 is applied to the select line, a program overshoot may occur. Since the voltage to be applied to the select line is increased to the target select voltage Vsel2 while the overshoot occurs, a third program overshoot ΔVos_pgm3 having a magnitude less than that of the first program overshoot ΔVos_pgm1 illustrated in FIG. 7 may occur.

By way of example, FIG. 9 illustrates that the program voltage Vpgm and the target select voltage Vsel2 are simultaneously applied. However, the target select voltage Vsel2 may be applied at another time during which an overshoot due to the program voltage Vpgm is present. For example, the target select voltage Vsel2 may be applied during a rising time of the program voltage Vpgm.

Figure 10:
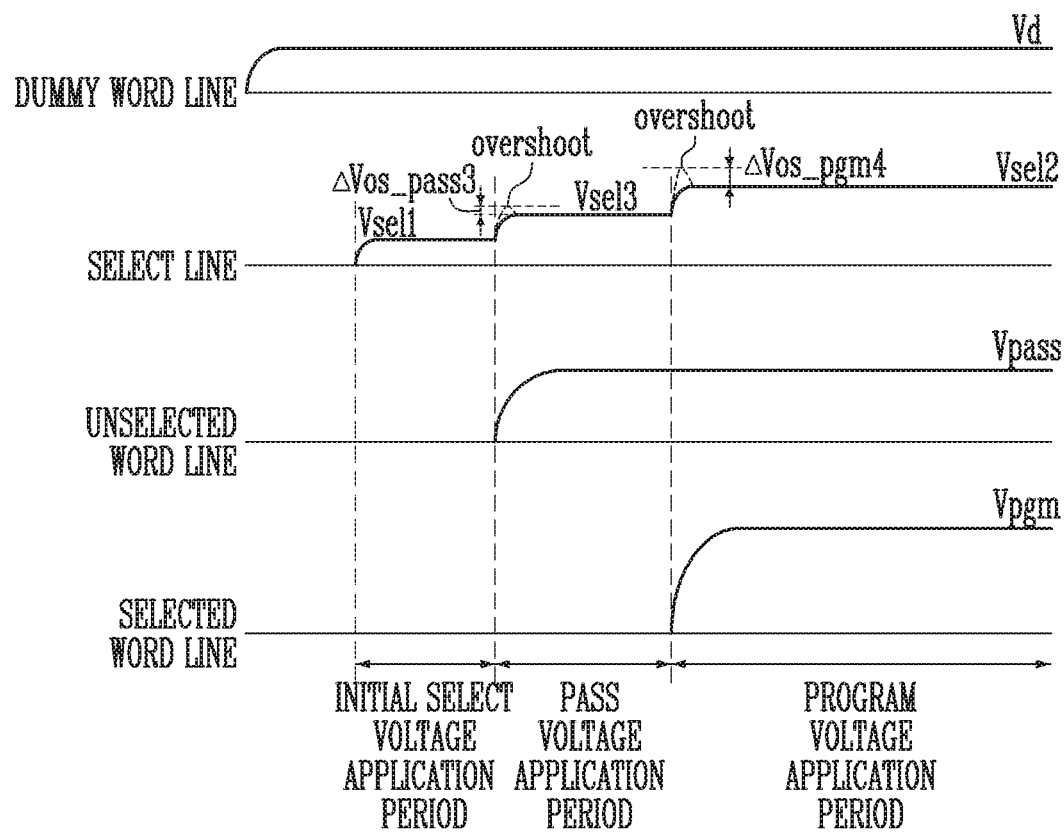
FIG. 10 is a timing diagram illustrating an overshoot management method using a dummy word line.

FIG. 10 is a timing diagram for describing an overshoot management method using a dummy word line.

Referring to FIG. 10, before an initial select voltage Vsel1 is applied to a select line, a target dummy voltage Vd may be applied to the dummy word line. The dummy word line may be a word line between the select line and a selected word line or between the select line and an unselected word line so as to mitigate an overshoot which may occur on the select line. In the case where a channel is boosted by a program voltage Vpgm applied to the selected word line or a pass voltage Vpass applied to the unselected word line, an effect of boosting on the select line may be reduced by dummy memory cells coupled to the dummy word line.

In other words, since a target dummy voltage Vd is applied in advance to the dummy word line, the magnitudes of a third pass overshoot ΔVos_pass3 and a fourth program overshoot ΔVos_pgm4 are less than those of the second pass overshoot ΔVos_pass2 and the third program overshoot ΔVos_pagm3.

By way of example, FIG. 10 illustrates that the pass voltage Vpass and the intermediate select voltage Vsel3 are simultaneously applied. However, the intermediate select voltage Vsel3 may be applied at another time during which an overshoot is present. For example, the intermediate select voltage Vsel3 may be applied during a rising time of the program voltage Vpass.

Furthermore, although FIG. 10 illustrates that the program voltage Vpgm and the target select voltage Vsel2 are simultaneously applied, the target select voltage Vsel2 may be applied at another time during which an overshoot due to the program voltage Vpgm is present. For example, the target select voltage Vsel2 may be applied during a rising time of the program voltage Vpgm.

Figure 11:
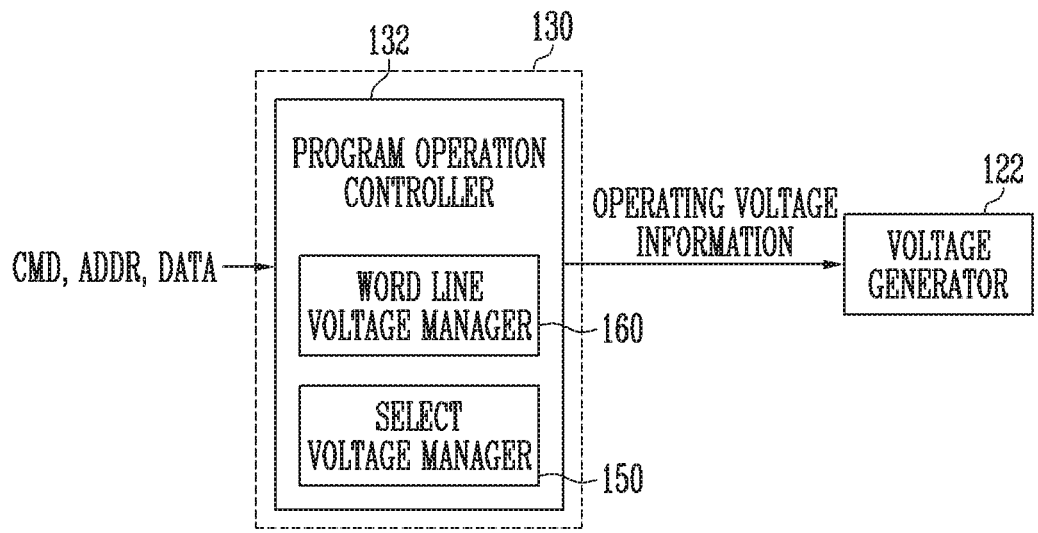
FIG. 11 is a block diagram illustrating a program operation controller in accordance with an embodiment of the present disclosure.

FIG. 11 is a block diagram illustrating a program operation controller 132 in accordance with an embodiment of the present disclosure.

Referring to FIG. 11, the control logic 130 may include the program operation controller 132. The program operation controller 132 may receive a command CMD, an address ADDR, and data DATA from the memory controller and transmit operating voltage information to the voltage generator 122. The operating voltage information may be included in the operating signal OPSIG described with reference to FIG. 2. The program operation controller 132 may include a word line voltage manager 160 and a select voltage manager 150. The word line voltage manager 160 may generate information about a voltage to be applied to a word line and a voltage application timing and transmit the information to the voltage generator 122. The select voltage manager 150 may generate Information about a voltage to be applied to a word line and a voltage application timing and transmit the information to the voltage generator 122. The select voltage application method illustrated in FIGS. 8 and 9 may be performed by the select voltage manager 150.

Figure 12:
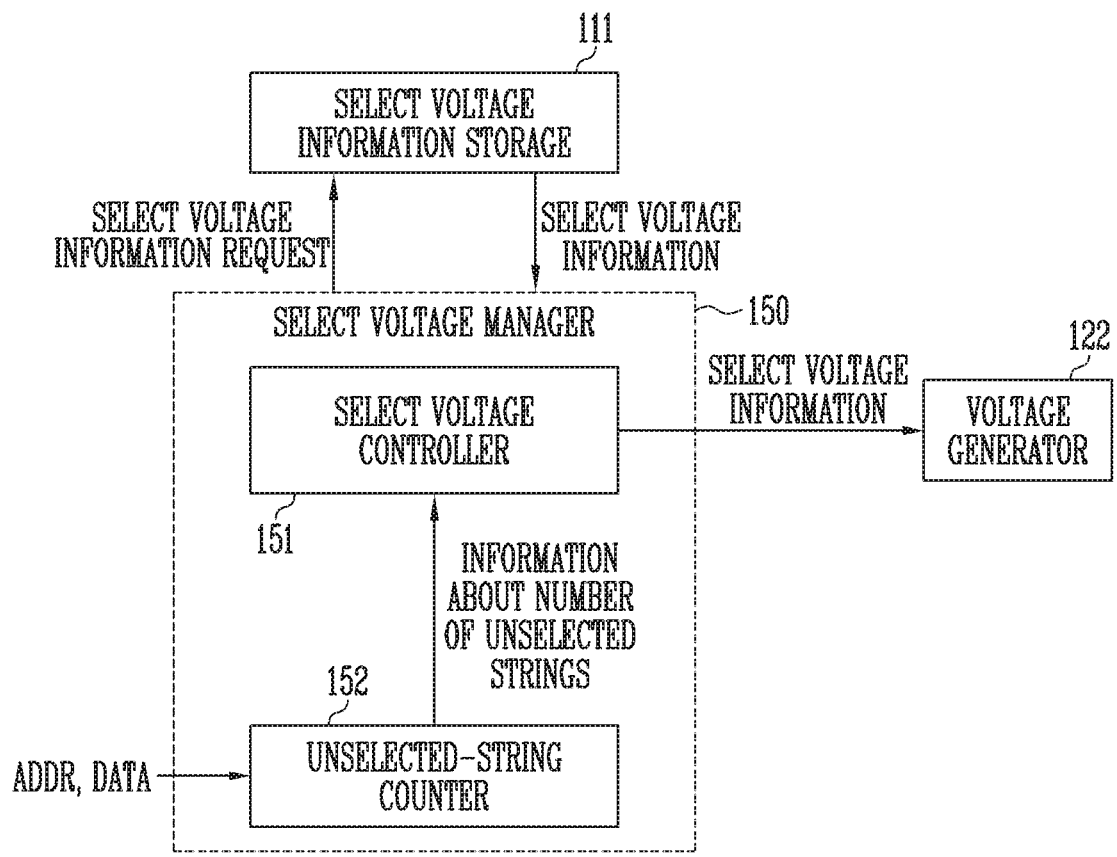
FIG. 12 is a block diagram illustrating a select voltage manager in accordance with an embodiment of the present disclosure.

FIG. 12 is a block diagram illustrating the select voltage manager 150 in accordance with an embodiment of the present disclosure.

Referring to FIG. 12, the select voltage manager 150 may include an unselected-string counter 152 and a select voltage controller 151. The unselected-string counter 152 may count the number of unselected cell strings based on an address ADDR and data DATA. The select voltage controller 151 may receive information about the number of unselected cell strings to acquire select voltage information. In an embodiment, a select voltage information storage 111 may be provided to store the select voltage information. In an embodiment, the select voltage controller 151 may make a request to the select voltage information storage 111 and acquire the select voltage information. In an embodiment, the select voltage controller 151 may directly calculate and acquire the select voltage information based on the information about the number of unselected cell strings. The select voltage controller 151 may transmit the acquired select voltage information to the voltage generator 122.

In an embodiment, the unselected-string counter 152 may count the number of unselected cell strings based on a column address CADD of the address ADDR. Since the column address CADD indicates positions of cells strings including selected memory cells, the number of selected cell strings and the number of unselected cell strings may be counted based on the column address CADD.

In an embodiment, the unselected string counter 152 may count the number of unselected cell strings based on the data DATA. For example, the number of 1's Indicated in the data DATA is counted, and the counted number of 1's may be determined to be the number of unselected cell strings.

In an embodiment, the select voltage controller 151 may acquire the select voltage information based on the information about the number of unselected cell strings. The select voltage information may indicate a voltage level of the select line and a voltage application timing of the select voltage. The select voltage controller 151 may compare the number of unselected cell strings with a reference number, and determine a voltage to be applied to the select line during an initial select voltage application period. For example, if the number of unselected cell strings is greater than the reference number, the peripheral circuit (120 of FIG. 2) may be controlled to apply the initial select voltage Vsel1 lower than that of a target select voltage Vsel2 to the select line during the initial select voltage application period. In an embodiment, the select voltage controller 151 may control the peripheral circuit 120 to reduce the initial select voltage Vsel1 to be applied to the select line during the initial select voltage application period, as the number of unselected cell strings is increased. For example, when the number of unselected cell strings is three, nine, or twelve, the peripheral circuit 120 may be controlled such that an initial select voltage Vsel1 of 1.3 V, 1.2 V, or 1.1 V, respectively, is applied to the select line during the initial select voltage application period. The select voltage controller 151 may control the peripheral circuit 120 to apply the target select voltage Vsel2 to the select line during a program voltage application period.

In an embodiment, the select voltage controller 151 may acquire the select voltage information from the select voltage information storage 111. The select voltage controller 151 may calculate a position at which the select voltage information corresponding to the information about the number of unselected cell strings is stored in the select voltage information storage 111. The select voltage controller 151 may read the select voltage information of the calculated position and transmit the select voltage information to the voltage generator 122.

As the number of cell strings which are self-boosted is increased, the magnitude of an overshoot which is caused on the select line may be increased. As the voltage level of the select voltage that has already been applied is reduced, the magnitude of an overshoot which is caused on the select line when a program voltage or a pass voltage is applied may be reduced. Therefore, as the number of cell strings which are self-boosted is increased, by reducing the voltage level of the initial select voltage Vsel1 to be applied to the select line, the magnitude of an overshoot on the select line may be prevented from increasing.

Figures 13, 14:
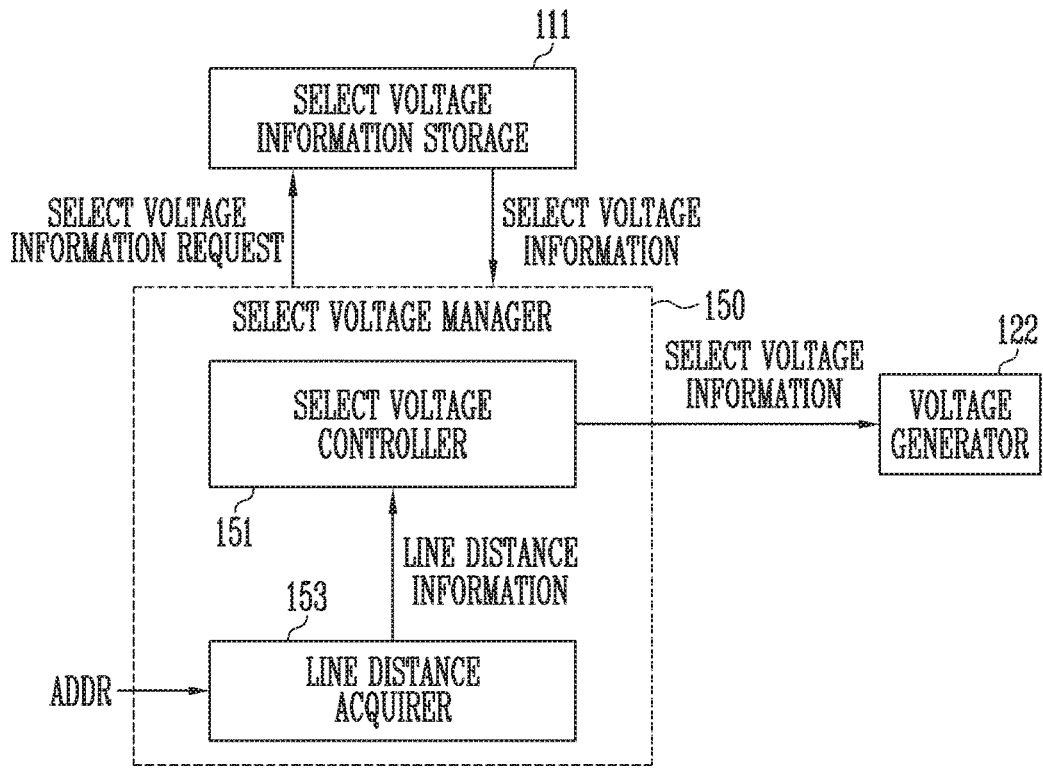
FIG. 13 is a block diagram illustrating a select voltage manager in accordance with an embodiment of the present disclosure.
FIG. 14 is a table illustrating aspects of a method of determining an initial select voltage based on the number of unselected cell strings.

FIG. 13 is a block diagram illustrating the select voltage manager 150 in accordance with an embodiment of the present disclosure.

Referring to FIG. 13, the select voltage manager 150 may include a line distance acquirer 153 and a select voltage controller 151. The line distance acquirer 153 may acquire line distance information based on an address ADDR. The select voltage controller 151 may receive the line distance information to acquire select voltage information. In an embodiment, a select voltage information storage 111 may be provided to store the select voltage information.

The select voltage information storage 111 may be included in the memory device 100. In an embodiment, the select voltage information may be stored in a Code Addressable Memory (CAM) blocks included in the memory cell array 110. In an embodiment, the select voltage information storage 111 may be CAM blocks. The select voltage information may be stored in the select voltage information storage 111 at a manufacturing step. In another embodiment, the select voltage information storage 111 may be a volatile memory located outside the memory cell array 110. The select voltage information stored in a CAM blocks may be loaded into the select voltage information storage 111 at a booting step. The booting step may be a step of loading data stored in CAM blocks into a volatile memory after power is applied to the memory device 100.

In an embodiment, the select voltage controller 151 may make a request to the select voltage information storage 111 and acquire the select voltage information. In an embodiment, the select voltage controller 151 may directly calculate and acquire the select voltage information based on a line distance, which is a distance between a selected word line and the select line. The select voltage controller 151 may transmit the acquired select voltage information to the voltage generator 122.

In an embodiment, the line distance acquirer 153 may acquire a line distance between the select line and the selected word line based on positions of the select line and the selected word line that are indicated by a row address RADD among the addresses ADDR. For example, the line distance may correspond to the number of unselected word lines disposed between the select line and the selected word line.

In an embodiment, the select voltage controller 151 may acquire the select voltage information based on the line distance information. The select voltage information may indicate a voltage level of the select line and a voltage application timing. The select voltage controller 151 may compare the line distance with a reference distance, and determine a voltage to be applied to the select line during an initial select voltage application period. For example, if the line distance is less than the reference distance, an initial select voltage Vsel1 lower than a target select voltage Vsel2 may be applied during the initial select voltage application period. In an embodiment, as the line distance is becomes shorter, the voltage level of the initial select voltage Vsel1 to be applied to the select line during the initial select voltage application period may be reduced. For example, when the number of unselected word lines disposed between the select line and the selected word line is nine, eight, or seven, an initial select voltage Vsel1 of 1.3 V, 1.2 V, or 1.1 V, respectively, may be applied to the select line during the initial select voltage application period. The select voltage controller 151 may control the peripheral circuit (120 of FIG. 2) to apply the target select voltage Vsel2 to the select line during a program voltage application period.

In an embodiment, the select voltage controller 151 may acquire the select voltage information from the select voltage information storage 111. The select voltage controller 151 may calculate a position at which the select voltage information is stored in the select voltage information storage 111, the position corresponding to the line distance. The select voltage controller 151 may read the select voltage information of the calculated position and transmit the select voltage information to the voltage generator 122.

As the line distance becomes shorter, the magnitude of an overshoot which may occur on the select line may be increased. As the voltage level of the select voltage that has already been applied is reduced, the magnitude of an overshoot which is caused on the select line when a program voltage or a pass voltage is applied may be reduced. Therefore, as the line distance is becomes shorter, by reducing the voltage level of the initial select voltage Vsel1 to be applied to the select line, the magnitude of an overshoot on the select line may be prevented from increasing.

FIG. 14 is a table for describing a method of determining an initial select voltage Vsel1 based on the number of unselected cell strings.

Referring to FIG. 14, the unselected-string counter 152 may receive data D1 to Dm and count the number of 1's (X1 to Xm) included in the data D1 to Dm. The counted number of 1's may be transmitted to the select voltage controller 151. The select voltage controller 151 may compare the number of 1's (X1 to Xm) with a reference number Xref. If the number of 1's is greater than the reference number Xref, the peripheral circuit (120 of FIG. 2) may be controlled to apply the initial select voltage Vsel1 to the select line during the initial select voltage application period so as to mitigate the overshoot. The initial select voltage Vsel1 may have a voltage level lower than that of the target select voltage Vsel2. The select voltage controller 151 may control the peripheral circuit 120 to apply the target select voltage Vsel2 to the select line during the program voltage application period.

Although FIG. 14 illustrates an embodiment in which the number of 1's is compared with one reference number, the select voltage controller 151 may compare the number of 1's with a plurality of reference numbers and determine a voltage level of a select voltage to be applied to the select line during the initial select voltage application period. For example, the select voltage controller 151 may control the peripheral circuit 120 such that: if the number of 1's is greater than a first reference number Xref1, the initial select voltage Vsel1 is applied during the initial select voltage application period; if the number of 1's is less than or equal to the first reference number Xref1 and greater than a second reference number Xref2, the intermediate select voltage Vsel3 is applied during the initial select voltage application period; and if the number of 1's is less than or equal to the second reference number Xref2, the target select voltage Vsel2 is applied during the initial select voltage application period. The initial select voltage Vsel1 may have a voltage level lower than that of the intermediate select voltage Vsel3. The intermediate select voltage Vsel3 may have a voltage level less than that of the target select voltage Vsel2.

In an embodiment, the unselected-string counter 152 may receive a column address CADD and count the number of unselected cell strings based on the column address CADD. The select voltage controller 151 may compare the number of unselected cell strings with a reference number using the method illustrated with reference to FIG. 14, and determine a select voltage to be applied to the select line during the initial select voltage application period.

FIG. 15 is a table for describing a method of determining an initial select voltage Vsel1 based on a line distance.

Referring to FIG. 15, the line distance acquirer 153 may receive addresses A1 to Am and acquire line distances DSTC1 to DSTCm between the selected word line and the select line. The line distance acquirer 153 may transmit the acquired line distances to the select voltage controller 151. The select voltage controller 151 may compare the line distances DSTC1 to DSTCm with a reference distance DSTCref. If the line distance is less than the reference distance, the select voltage controller 151 may control the peripheral circuit (120 of FIG. 2) to apply the initial select voltage Vsel1 to the select line during the initial select voltage application period so as to mitigate the overshoot. The initial select voltage Vsel1 may have a voltage level lower than that of the target select voltage Vsel2. The select voltage controller 151 may control the peripheral circuit 120 to apply the target select voltage Vsel2 to the select line during the program voltage application period.

Although FIG. 15 illustrates an embodiment in which the line distance is compared with one reference distance, the select voltage controller 151 may compare the line distance with a plurality of reference distances and determine a voltage level of a select voltage to be applied to the select line during the initial select voltage application period. For example, the select voltage controller 151 may control the peripheral circuit 120 such that: if the line distance is less than a first reference distance DSTCref1, the initial select voltage Vsel1 is applied during the initial select voltage application period; if the line distance is greater than or equal to the first reference distance DSTCref1 and less than the second reference distance DSTCref2, the intermediate select voltage Vsel3 is applied during the initial select voltage application period; and if the line distance is greater than or equal to the second reference distance DSTCref2, the target select voltage Vsel2 is applied during the initial select voltage application period. The initial select voltage Vsel1 may have a voltage level lower than that of the intermediate select voltage Vsel3. The intermediate select voltage Vsel3 may have a voltage level less than that of the target select voltage Vsel2.

Figure 16:
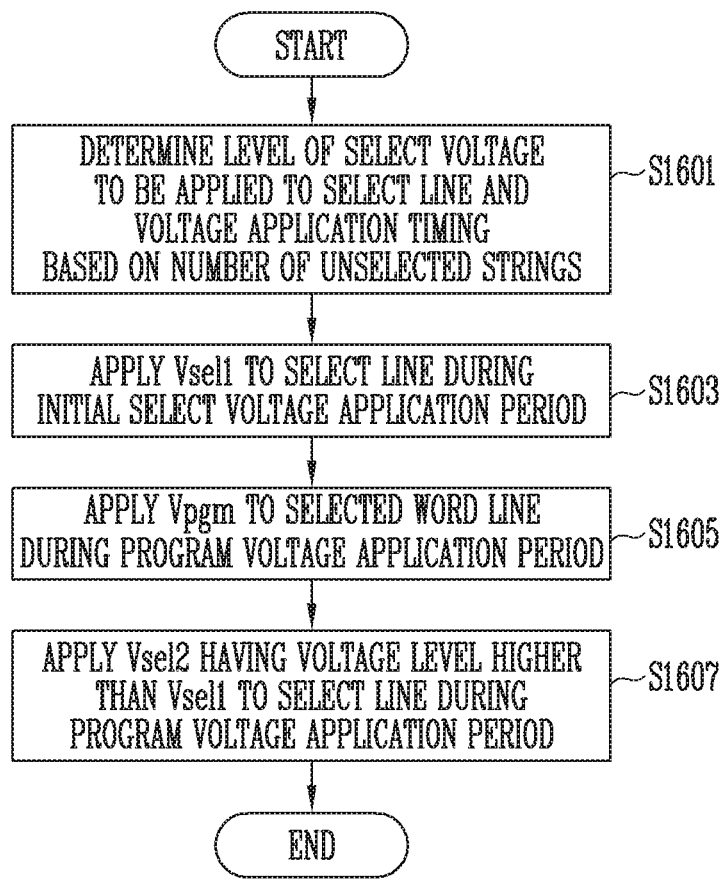
FIG. 16 is a flowchart illustrating a method of applying a select voltage based on the number of unselected cell strings.

FIG. 16 is a flowchart for describing a method of applying a select voltage based on the number of unselected cell strings.

Referring to FIG. 16, at step S1601, the unselected-string counter 152 may count the number of unselected cell strings based on data DATA or an address ADDR, and the select voltage controller 151 may determine the level of a select voltage to be applied to the select line and a time of applying the select voltage (voltage application timing) based on the number of unselected cell strings. For example, in the case where the number of unselected cell strings is greater than the reference number, a voltage to be applied to the select line during the initial select voltage application period may be determined to be 1 V, and a voltage to be applied to the select line during the program voltage application period may be determined to be 1.2 V. In the case where the number of unselected cell strings is less than or equal to the reference number, the voltage to be applied to the select line during the initial select voltage application period and the voltage to be applied to the select line during the program voltage application period may be determined to be 1.2 V.

At step S1603, the select voltage controller 151 may control the peripheral circuit 120 to apply to the select line a voltage of the determined voltage level and at the determined time. In the case where the number of unselected cell strings is greater than the reference number, the select voltage controller 151 may control the peripheral circuit 120 to apply the initial select voltage Vsel1 to the select line during the initial select voltage application period. The initial select voltage Vsel1 may have a voltage level less than an inhibit voltage precharged to a bit line coupled to an unselected cell string.

At step S1605, during the program voltage application period, the select voltage controller 151 may control the peripheral circuit 120 to apply a program voltage Vpgm to the selected word line so as to store data in a selected memory cell.

At step S1607, the select voltage controller 151 may control the peripheral circuit 120 to apply the target select voltage Vsel2 to the select line during the program voltage application period in which the program voltage Vpgm is applied to the selected word line. The target select voltage Vsel2 may have a voltage level higher than that of the initial select voltage Vsel1. The target select voltage Vsel2 may have a voltage level equal to the inhibit voltage.

Figure 17:
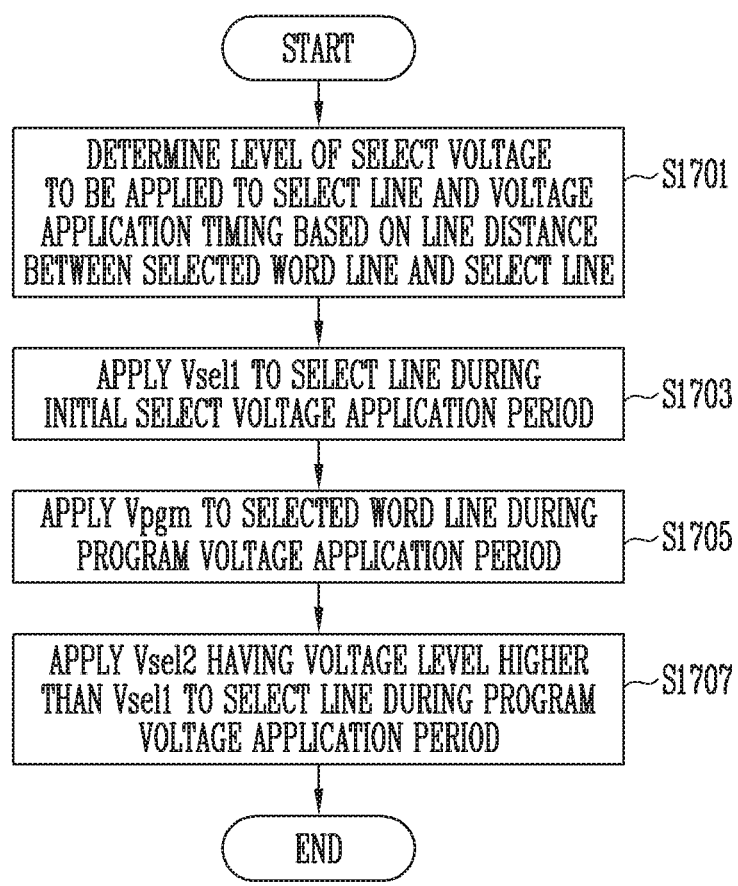
FIG. 17 is a flowchart illustrating a method of applying a select voltage based on a line distance.

FIG. 17 is a flowchart for describing a method of applying a select voltage based on a line distance.

Referring to FIG. 17, at step S1701, the line distance acquirer 153 may acquire a line distance between the selected word line and the select line based on the address ADDR. The select voltage controller 151 may determine the level of a select voltage to be applied to the select line and a time at which such voltage Is to be applied based on the line distance. For example, in the case where the line distance is less than the reference distance, the voltage to be applied to the select line during the initial select voltage application period may be determined to be 1 V, and the voltage to be applied to the select line during the program voltage application period may be determined to be 1.2 V.

At step S1703, the select voltage controller 151 may control the peripheral circuit 120 to apply to the select line a voltage of the determined voltage level at the determined time. If the line distance is less than the reference distance, the select voltage controller 151 may control the peripheral circuit 120 to apply the initial select voltage Vsel1 to the select line during the initial select voltage application period. The initial select voltage Vsel1 may have a voltage level less than an inhibit voltage precharged to a bit line coupled to an unselected cell string.

At step S1705, during the program voltage application period, the select voltage controller 151 may control the peripheral circuit 120 to apply a program voltage Vpgm to the selected word line so as to store data in a selected memory cell.

At step S1707, the select voltage controller 151 may control the peripheral circuit 120 to apply the target select voltage Vsel2 to the select line during the program voltage application period in which the program voltage Vpgm is applied to the selected word line. The target select voltage Vsel2 may have a voltage level higher than that of the initial select voltage Vsel1. The target select voltage Vsel2 may have a voltage level equal to the inhibit voltage.

Figure 18:
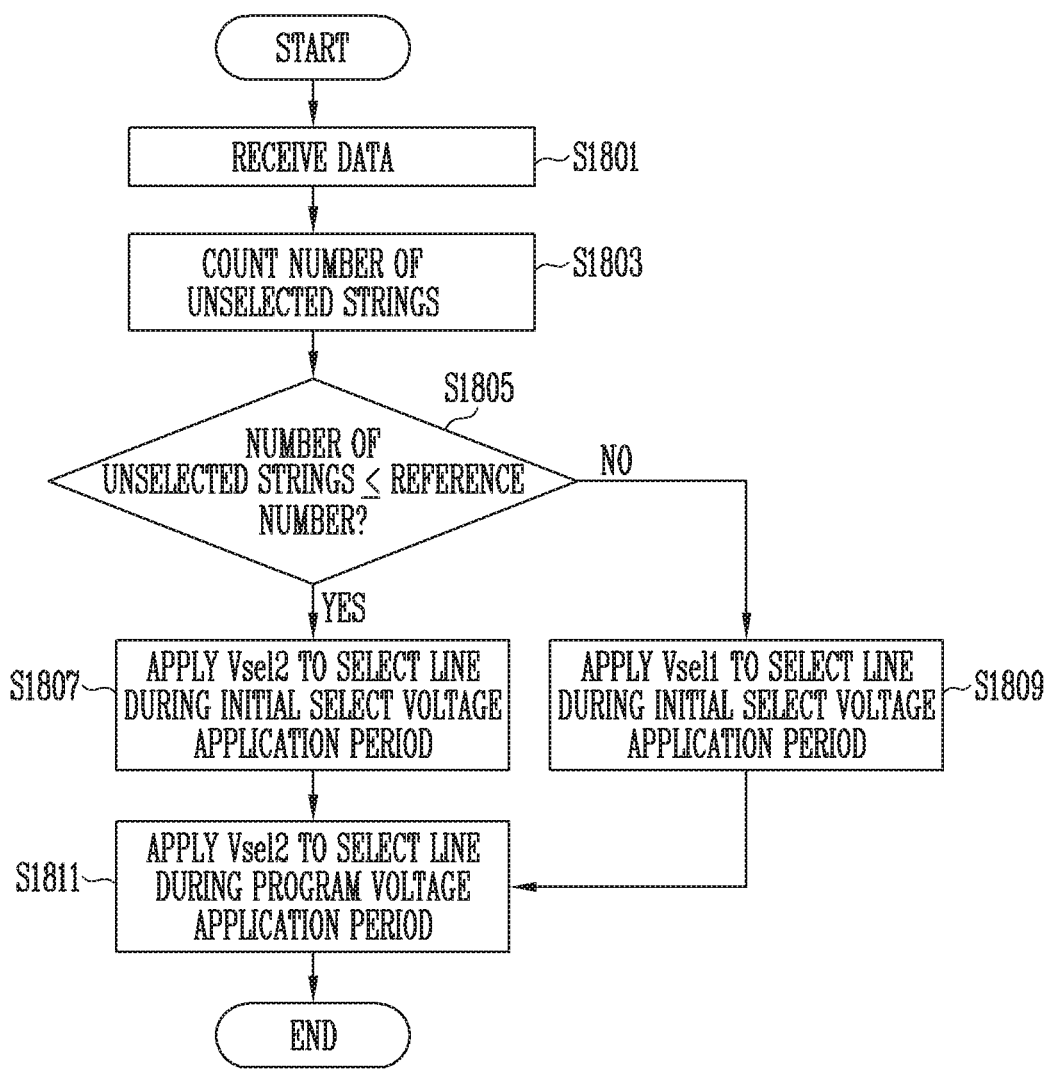
FIG. 18 is a flowchart illustrating a method of applying a select voltage based on the number of unselected cell strings.

FIG. 18 is a flowchart for describing a method of applying a select voltage based on the number of unselected cell strings.

Referring to FIG. 18, at step S1801, the unselected-string counter 152 may receive data DATA through the data input/output circuit 124.

At step S1803, the unselected string counter 152 may count the number of unselected cell strings based on the data DATA. For example, the number of 1's included in the data DATA may be counted and determined to be the number of unselected cell strings. Although not illustrated in FIG. 18, the unselected-string counter 152 may receive the address ADDR and count the number of unselected cell strings based on the column address CADD.

At step S1805, the select voltage controller 151 may compare the number of unselected cell strings with the reference number. If the number of unselected cell strings is less than or equal to the reference number, the process may proceed to step S1807. If the number of unselected cell strings is greater than the reference number, the process may proceed to step S1809.

At step S1807, the select voltage controller 151 may control the peripheral circuit 120 to apply the target select voltage Vsel2 to the select line during the initial select voltage application period.

At step S1809, the select voltage controller 151 may control the peripheral circuit 120 to apply the initial select voltage Vsel1 to the select line, during the initial select voltage application period. The target select voltage Vsel2 may have a voltage level equal to an inhibit voltage precharged to a bit line coupled to an unselected cell string. The initial select voltage Vsel1 may have a voltage level higher than zero and lower than that of the target select voltage Vsel2.

At step S1811, the select voltage controller 151 may control the peripheral circuit 120 to apply the target select voltage Vsel2 to the select line during the program voltage application period following the initial select voltage application period, regardless of the number of unselected cell strings.

Figure 19:
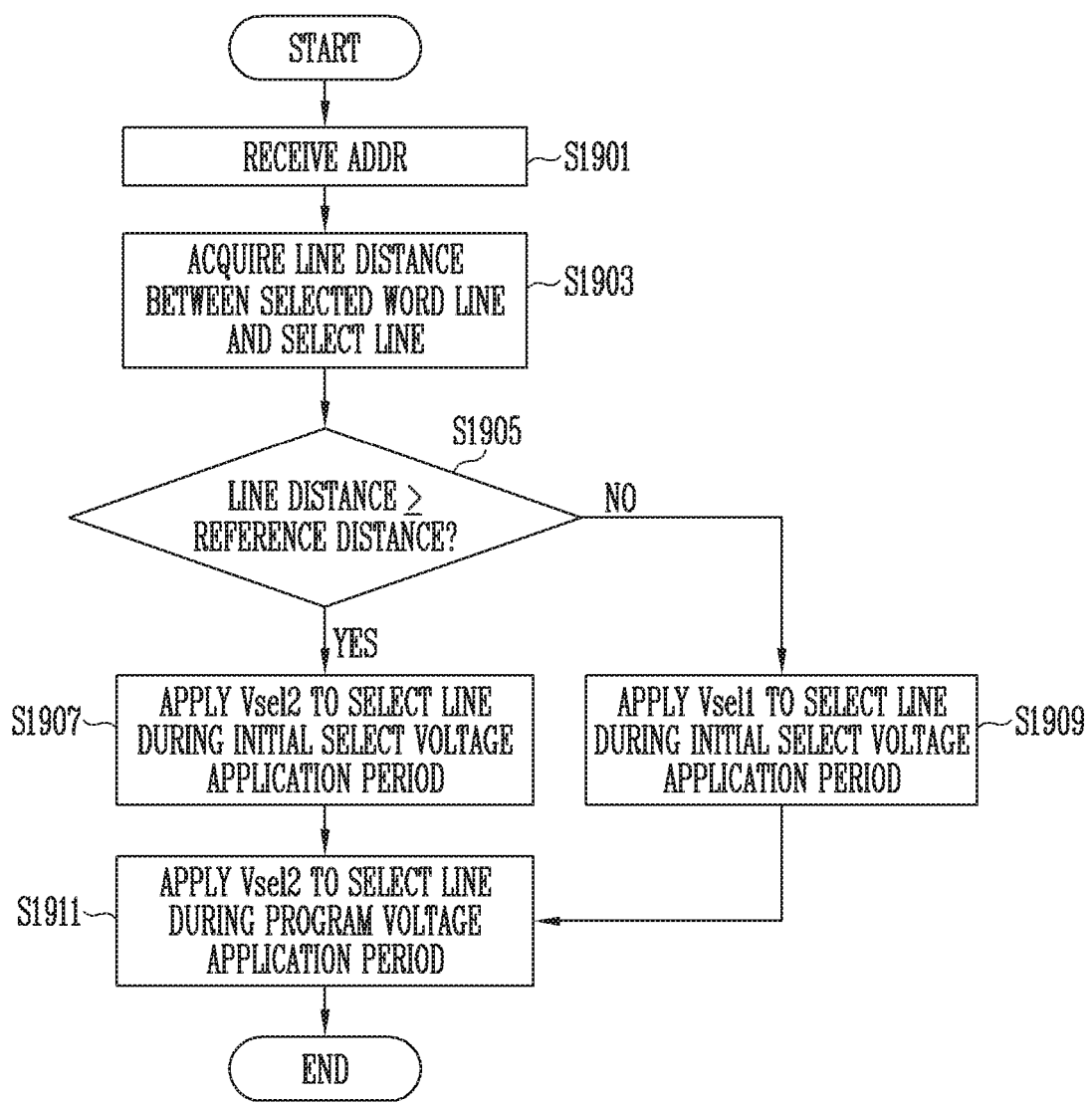
FIG. 19 is a flowchart illustrating a method of applying a select voltage based on a line distance.

FIG. 19 is a flowchart for describing a method of applying a select voltage based on a line distance.

Referring to FIG. 19, at step S1901, the line distance acquirer 153 may receive an address ADDR from the memory controller.

At step S1903, the line distance acquirer 153 may acquire a line distance between the selected word line and the select line based on the address ADDR. For example, the line distance between the selected word line and the select line may be calculated using a physical address of a selected page indicated by the row address RADD.

At step S1905, the select voltage controller 151 may compare the line distance with the reference distance. If the line distance is greater than or equal to the reference distance, the process may proceed to step S1907. If the line distance is less than the reference distance, the process may proceed to step S1909.

At step S1907, the select voltage controller 151 may control the peripheral circuit 120 to apply the target select voltage Vsel2 to the select line during the initial select voltage application period.

At step S1909, the select voltage controller 151 may control the peripheral circuit 120 to apply the initial select voltage Vsel1 to the select line, during the initial select voltage application period. The target select voltage Vsel2 may have a voltage level equal to an inhibit voltage precharged to a bit line coupled to an unselected string. The Initial select voltage Vsel1 may have a voltage level higher than zero and lower than that of the target select voltage Vsel2.

At step S1911, the select voltage controller 151 may control the peripheral circuit 120 to apply the target select voltage Vsel2 to the select line during the program voltage application period following the initial select voltage application period, regardless of the line distance.

Figure 20:
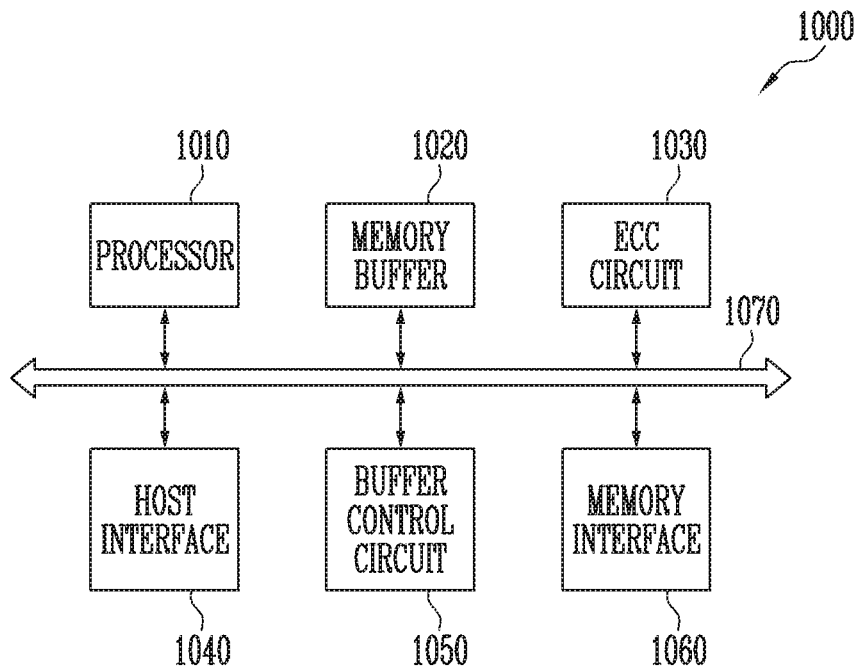
FIG. 20 is a block diagram illustrating an embodiment of a memory controller of FIG. 1.

FIG. 20 is a diagram illustrating an embodiment of a memory controller of FIG. 1.

Referring to FIG. 20, a memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device by using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA Into the PBA using a mapping table. Various address mapping methods using the FTL may be used depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device 100. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in, as a component of, the memory interface 1060.

The host interface 1040 may communicate with the external host under control of the processor 1010. The host interface 1040 may perform communication using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and/or a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 21:
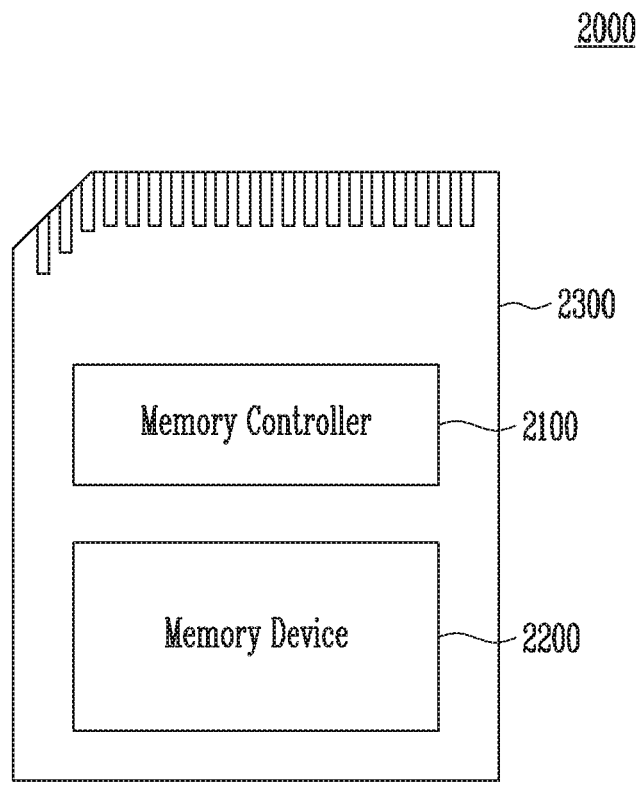
FIG. 21 is a block diagram illustrating a memory card system to which the storage device is applied in accordance with an embodiment of the present disclosure.

FIG. 21 is a block diagram illustrating a memory card system 2000 to which the storage device is applied in accordance with an embodiment of the present disclosure.

Referring FIG. 21, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and the host. The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processor, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and/or nonvolatile memory express (NVMe) protocols. In an embodiment, the connector 2300 may be defined by at least one of the above-described communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card, such as a personal computer memory card international association (PCM-CIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 22:
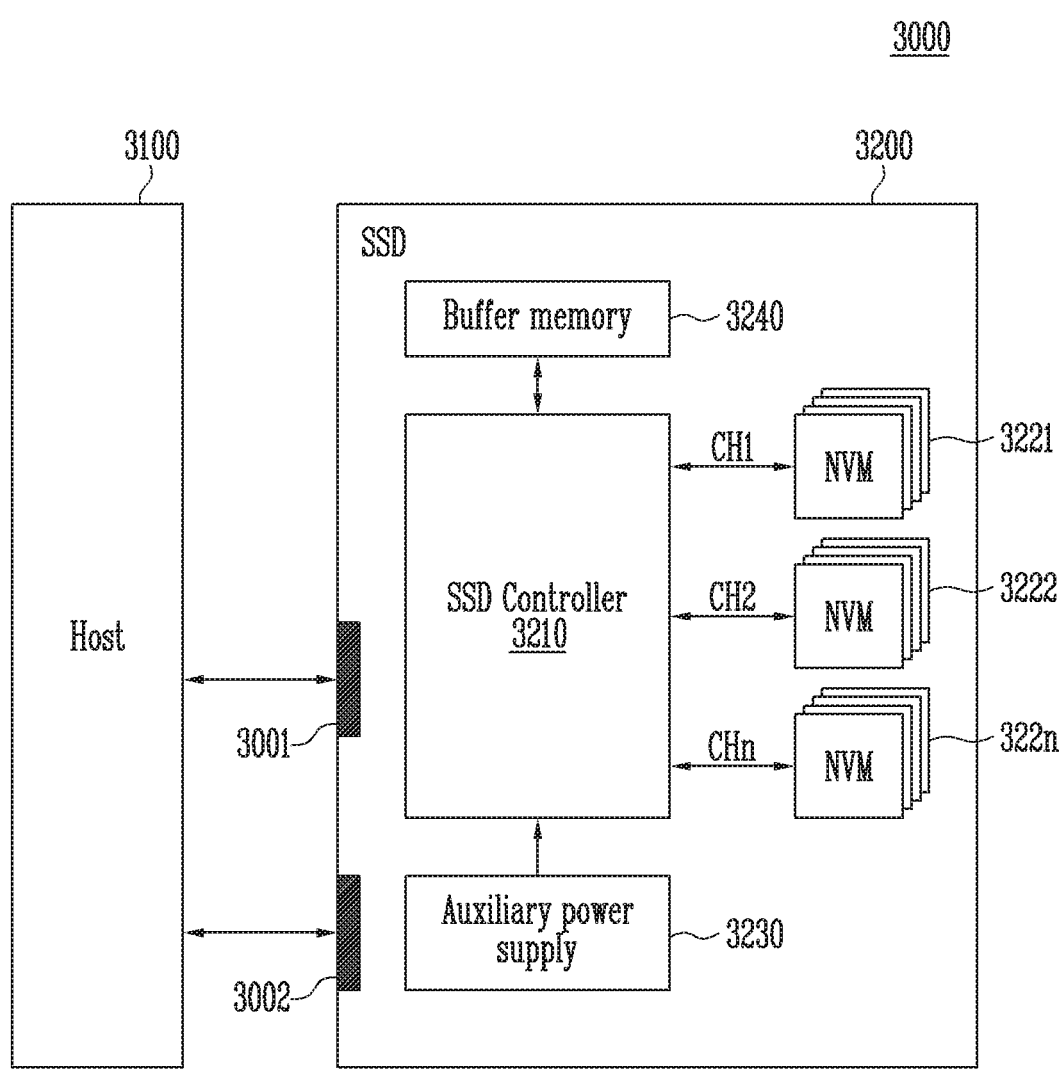
FIG. 22 is a block diagram illustrating a solid state drive (SSD) system to which the storage device is applied in accordance with an embodiment of the present disclosure.

FIG. 22 is a block diagram illustrating a solid state drive (SSD) system 3000 to which the storage device is applied in accordance with an embodiment of the present disclosure.

Referring to FIG. 22, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be based on an Interface between the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as an FRAM, a ReRAM, an STT-MRAM, and a PRAM.

Figure 23:
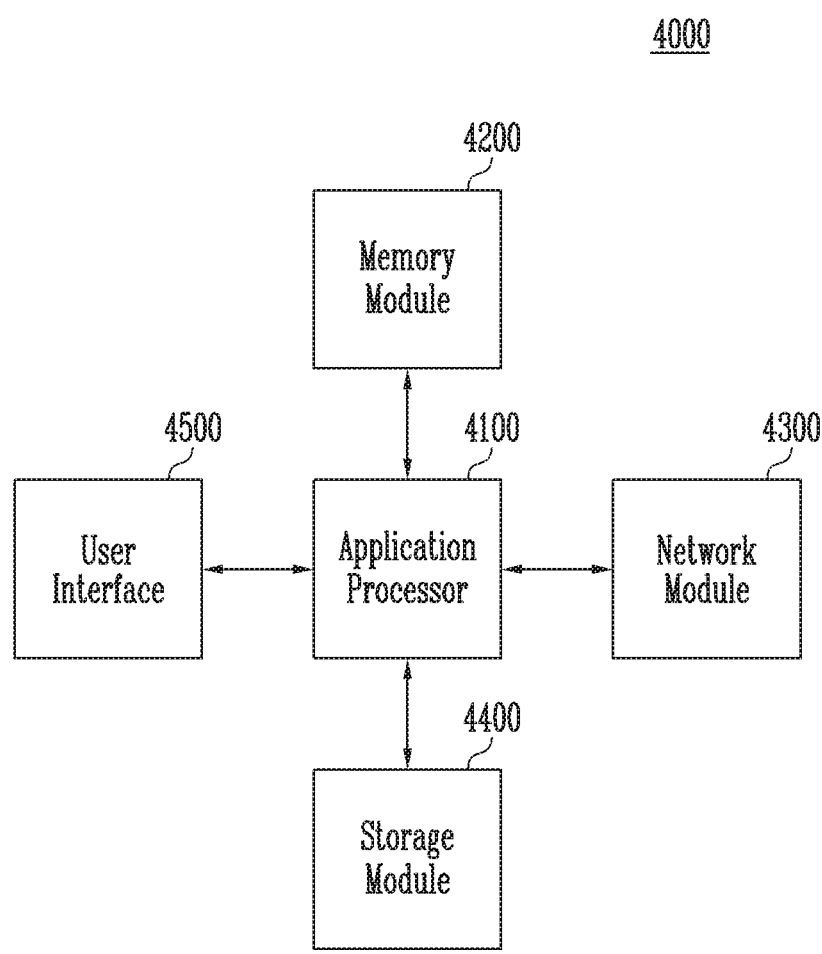
FIG. 23 is a block diagram illustrating a user system to which the storage device is applied in accordance with an embodiment of the present disclosure.

FIG. 23 is a block diagram illustrating a user system 4000 to which the storage device is applied in accordance with an embodiment of the present disclosure.

Referring to FIG. 23, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, and the like for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include any of a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be Implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as that of the memory device 100 described above with reference to FIG. 1. The storage module 4400 may be operated in the same manner as that of the storage device 50 described above with reference to FIG. 1.

The user interface 4500 may include any of various interfaces for inputting data or instructions to the application processor 4100 or outputting data to an external device. In an embodiment, the user interface 4500 may include a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and/or a motor.

A memory device and a method of operating the memory device in accordance with an embodiment of the present disclosure may provide Improved overshoot management performance.

Although embodiments of the present invention have been disclosed, those skilled in the art will appreciate in light of the present disclosure that various modifications, additions and substitutions are possible, without departing from the scope and spirit of the present invention.

Therefore, the scope of the present invention is not limited to any of the disclosed embodiments nor any specific detail. Rather, the present invention is defined by the appended claims and their equivalents.

In the above-discussed embodiments, certain steps may be selectively performed, skipped or combined with other steps. In addition, steps need not be always performed in disclosed order. More generally, the disclosed embodiments are provided to help those with ordinary knowledge in this art more clearly understand the present invention, rather than to limit the bounds of the present invention. In other words, one of ordinary skill in the art to which the present disclosure pertains will be able to easily understand that various modifications are possible based on the technical scope of the present disclosure.

In the foregoing description, specific terms or words should be construed in accordance with the spirit of the present invention without limiting the subject matter thereof. It should be understood that many variations and modifications of the basic inventive concept described herein still fall within the spirit and scope of the present invention as defined in the appended claims and their equivalents.

What is claimed is:

1. A method of operating a memory device comprising a plurality of cell strings each including a select transistor and a plurality of memory cells, the method comprising:

applying a select voltage to a select line coupled in common to respective select transistors in the plurality of cell strings; and applying a program voltage level to a selected word line coupled in common to selected memory cells among the plurality of memory cells in the plurality of cell strings, wherein the applying of the select voltage comprises applying a first select voltage level to the select line during a first time period, and applying a second select voltage level to the select line after the first time period, the second select voltage level being higher than the first select voltage level, wherein starting the applying of the program voltage level and starting the applying of the second select voltage level are simultaneous, and wherein the first select voltage level is higher than 0 V.

2. The method according to claim 1, wherein the applying of the select voltage further comprises:

applying a pass voltage to unselected word lines coupled to unselected memory cells among the plurality of memory cells during a second time period following the first time period; and applying, to the select line, a third select voltage level higher than the first select voltage level during the second time period.

3. The method according to claim 2, wherein the third select voltage level is less than or equal to the second select voltage level.

4. The method according to claim 1, wherein the second select voltage level is less than or equal to a bit line voltage level of a bit line voltage to be applied to bit lines coupled to the plurality of cell strings.

5. A method of operating a memory device comprising a plurality of cell strings each including a select transistor and a plurality of memory cells, the method comprising:

applying a first select voltage to a select line coupled to the select transistor during a first time period; and applying a second select voltage to the select line while applying a program voltage level to a selected word line coupled in common to selected memory cells among the plurality of memory cells in the plurality of cell strings during a second time period, wherein the applying of the first select voltage comprises applying a first select voltage level to the select line during the first time period, and the applying of the second select voltage comprises applying a second select voltage level to the select line after the first time period, the second select voltage level being higher than the first select voltage level, wherein starting the applying of the program voltage level and starting the applying of the second select voltage level are simultaneous, and wherein the first select voltage level is higher than 0 V.

6. The method according to claim 5, wherein the first select voltage level is determined depending on the number of unselected cell strings that do not include the selected memory cells among the plurality of cell strings.

7. The method according to claim 6, wherein, when the number of unselected cell strings is greater than a reference number, the first select voltage level is lower than the second select voltage level.

8. The method according to claim 6, wherein, when the number of unselected cell strings is less than or equal to a reference number, the first select voltage level is equal to the second select voltage level.

9. The method according to claim 5, wherein, as the number of unselected cell strings that do not include the selected memory cells among the plurality of cell strings is increased, the first select voltage level is reduced.

10. The method according to claim 5, wherein the first select voltage level is determined depending on a distance between the selected word line and the select line.

11. The method according to claim 10, wherein, as the distance between the selected word line and the select line becomes shorter, the first select voltage level is reduced.

12. The method according to claim 10, wherein, when the distance between the selected word line and the select line is less than a reference distance, the first select voltage level is lower than the second select voltage level.

13. The method according to claim 10, wherein, when the distance between the selected word line and the select line is greater than or equal to a reference distance, the first select voltage level is equal to the second select voltage level.

14. A memory device comprising:
  a plurality of cell strings each including a select transistor and a plurality of memory cells coupled in series to each other;
  a peripheral circuit configured to perform a program operation of storing data in selected memory cells among the plurality of memory cells in the cell strings; and
  control logic configured to control the peripheral circuit to apply a select voltage to a select line coupled in common to a plurality of select transistors in the cell strings, and apply a program voltage level to a selected word line coupled to the selected memory cells,
  wherein the control logic comprises a program operation controller configured to control the peripheral circuit to apply a first select voltage to the select line during a first time period, and apply a second select voltage having a second select voltage level higher than a first select voltage level of the first select voltage to the select line while applying the program voltage level to the selected word line, during a second time period,
  wherein the peripheral circuit applies the first select voltage level to the select line during the first time period, and the peripheral circuit applies the second select voltage level to the select line after the first time period, the second select voltage level being higher than the first select voltage level,
  wherein the peripheral circuit simultaneously starts applying the program voltage level and the second select voltage level, and
  wherein the first select voltage level is higher than 0 V.

15. The memory device according to claim 14, wherein the program operation controller controls the peripheral circuit
  to apply a pass voltage to unselected word lines coupled to unselected memory cells among the plurality of memory cells, during a third time period between the first time period and the second time period, and
  to apply a third select voltage level higher than the first select voltage level to the select line.

16. The memory device according to claim 15, wherein the third select voltage level is less than or equal to the second select voltage level.

17. The memory device according to claim 14, wherein the second select voltage level is less than or equal to a bit line voltage level of a bit line voltage to be applied to bit lines coupled to the plurality of cell strings.

18. The memory device according to claim 14, wherein the program operation controller determines the first select voltage level based on the number of unselected cell strings among the cell strings or a line distance between the selected word line and the select line.

* * * * *